(12) United States Patent
Tatsumi

(10) Patent No.: US 10,345,627 B2
(45) Date of Patent: Jul. 9, 2019

(54) DRIVING CIRCUIT FOR OPTICAL MODULATOR

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/876,870

(22) Filed: Jan. 22, 2018

(65) Prior Publication Data

US 2018/0210239 A1    Jul. 26, 2018

(30) Foreign Application Priority Data

Jan. 25, 2017   (JP) .................. 2017-011519

(51) Int. Cl.
*G02F 1/00* (2006.01)
*G02F 1/01* (2006.01)
(Continued)

(52) U.S. Cl.
CPC .......... *G02F 1/0123* (2013.01); *G02F 1/0327* (2013.01); *H03F 3/195* (2013.01);
(Continued)

(58) Field of Classification Search
CPC .. H03F 3/195; H03F 3/45089; H03F 3/45475; H03F 3/68; H03F 3/605; H03F 3/3435; H03F 6/45237; H03F 3/45278; H03F 3/345; H03F 3/4508; H03F 3/45; H03F 3/50; H03F 3/4521; H03F 3/45224; H03F 3/45322; H03F 1/34; H03F 1/342;
(Continued)

(56) References Cited

U.S. PATENT DOCUMENTS

| | | | | |
|---|---|---|---|---|
| 3,725,592 A | * | 4/1973 | Tanaka ............ | H04B 1/66 348/384.1 |
| 8,704,592 B2 | * | 4/2014 | Tatsumi ............ | H03F 3/45089 330/286 |

(Continued)

FOREIGN PATENT DOCUMENTS

| | | |
|---|---|---|
| JP | 09-130170 | 5/1997 |
| JP | 2010-272918 | 12/2010 |
| JP | 2016-54452 | 4/2016 |

*Primary Examiner* — Loha Ben
(74) *Attorney, Agent, or Firm* — Smith, Gambrell & Russell, LLP

(57) ABSTRACT

In an exemplary embodiment, a plurality of differential amplification circuits has: first differential amplification circuits each including a differential pair circuit to generate the differential signal according to the differential input signal, a delay line, and a current source to supply a current to the differential pair circuit via the delay line; and second differential amplification circuits each including a differential pair circuit to generate the differential signal according to the differential input signal, and a current source to directly supply a current to the differential pair circuit. The first differential amplification circuits and the second differential amplification circuits are mutually connected in parallel between the pair of input-side transmission lines and the pair of output-side transmission lines.

10 Claims, 19 Drawing Sheets

(51) Int. Cl.
| | | |
|---|---|---|
| *G02F 1/03* | (2006.01) | |
| *H03F 3/45* | (2006.01) | |
| *H03F 3/60* | (2006.01) | |
| *H03F 3/68* | (2006.01) | |
| *H04B 1/00* | (2006.01) | |
| *H03F 3/195* | (2006.01) | |
| *H04B 10/516* | (2013.01) | |
| *H04B 10/2507* | (2013.01) | |
| *H04B 10/54* | (2013.01) | |

(52) U.S. Cl.
CPC ..... *H03F 3/45089* (2013.01); *H03F 3/45475* (2013.01); *H03F 3/605* (2013.01); *H03F 3/68* (2013.01); *H04B 10/2507* (2013.01); *H04B 10/516* (2013.01); *H04B 10/54* (2013.01); *G02F 1/00* (2013.01); *H03F 3/45* (2013.01); *H03F 2200/451* (2013.01); *H03F 2203/45612* (2013.01); *H04B 1/00* (2013.01)

(58) Field of Classification Search
CPC ..... H03F 2200/451; H03F 2203/45612; H04B 10/00; H04B 10/2507; H04B 10/40; H04B 10/50; H04B 10/516; H04B 10/54; H04B 10/588; H04B 10/60; H04B 1/00; H04B 1/38; G05F 1/613; G02F 1/00; G02F 1/01; G02F 1/0121; G02F 1/0123; G02F 1/0327
USPC ................ 359/237–239, 128, 276, 279, 333; 398/128, 130, 135–145, 158–162; 455/142, 144, 254, 293
See application file for complete search history.

(56) References Cited

U.S. PATENT DOCUMENTS

| | | | | |
|---|---|---|---|---|
| 8,907,722 | B2* | 12/2014 | Tatsumi | .............. H03F 3/45076 330/124 R |
| 9,369,100 | B2* | 6/2016 | Tatsumi | .................. H03F 3/605 |
| 9,500,886 | B2* | 11/2016 | Tatsumi | ................ G02F 1/0121 |
| 9,590,576 | B2* | 3/2017 | Tatsumi | .............. H03F 3/45085 |
| 9,641,136 | B2* | 5/2017 | Tatsumi | .................. H03F 1/486 |

* cited by examiner

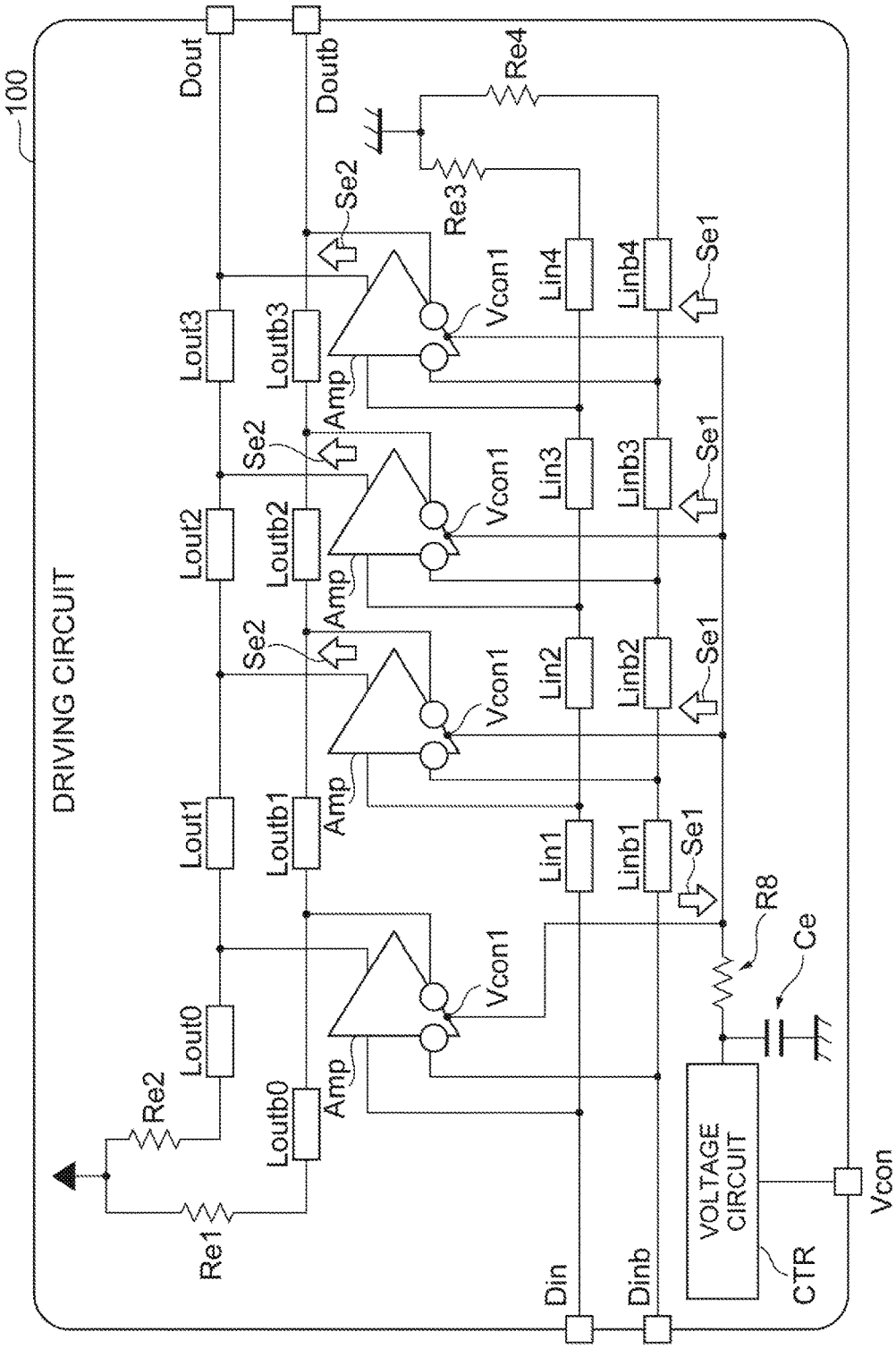

*Fig.13*

$$\mathbf{I}_{out} = I_1 e^{j(\omega(t-t_{d1}))} + I_2 e^{j(\omega(t-t_{d2}))} + \cdots + I_8 e^{j(\omega(t-t_{d8}))} \cdots \quad (2-1)$$

$$\mathbf{I}_{out} = I_a e^{j\omega t} \cdots \quad (2-2)$$

$$\mathbf{I}_{out} = \frac{I_a}{2} e^{j\omega t} + \frac{I_a}{2} e^{j(\omega(t-t_d))} = \frac{I_a}{2} e^{j\omega t} \left(1 + e^{-j\omega t_d}\right) \cdots \quad (2-3)$$

DRIVING CIRCUIT FOR OPTICAL MODULATOR

CROSS-REFERENCE TO RELATED APPLICATIONS

This application is based on and claims priority from Japanese Patent Application No. 2017-011519 filed on Jan. 25, 2017, with the Japan Patent Office, the disclosures of which are incorporated herein in their entireties by reference.

TECHNICAL FIELD

An exemplary embodiment of the present disclosure relates to a driving circuit for an optical modulator used in an optical transmitter or the like.

BACKGROUND

An optical transceiver is frequently used in a transmission system conducting optical fiber communications. The optical transceiver includes an optical transmitter and an optical receiver. The optical transmitter converts an electric signal into an optical signal, and transmits the optical signal to an optical waveguide, such as optical fiber. As a system of converting an electric signal to an optical signal, there is a system using a light source and an optical modulator. The light source is a semiconductor laser or the like, and outputs CW (Continuous Wave) light. The optical modulator modulates the CW light output from the light source according to an electric signal (a driving signal), and outputs a modulated optical signal. A driving circuit is used to drive the optical modulator. The driving circuit generates a driving voltage according to the electric signal and supplies a bias voltage serving as a reference voltage of the driving voltage.

Since the electric signal drives the driving circuit at high speed, a reflection coefficient of the driving circuit needs to be suppressed up to a frequency of, for example, about 40 [GHz]. Further, a high common-mode rejection ratio is required as circuit performance for high speed communication.

SUMMARY

In one aspect, a driving circuit for driving an optical modulator is provided with: differential input terminals to receive a differential input signal from outside; a pair of input-side transmission lines to transmit the differential input signal received through the differential input terminals; a plurality of differential amplification circuits to receive the differential input signal through the pair of input-side transmission lines and to output respective amplified differential input signals as differential signals; the plurality of differential amplification circuits consists of a plurality of first differential amplification circuits and a plurality of second differential amplification circuits; each first differential amplification circuit includes a first differential pair circuit to generate one of the differential signals according to the differential input signal, a delay line to delay a passing signal, and a first current source to supply a first current to the first differential pair circuit via the delay line; each second differential amplification circuit includes a second differential pair circuit to generate one of the differential signals according to the differential input signal, and a second current source to directly supply a second current to the second differential pair circuit; a pair of output-side transmission lines to transmit the differential signals output from the plurality of differential amplification circuits; and differential output terminals to mutually superpose the differential signals output from the plurality of differential amplification circuits for outputting a superposed signal to the outside. The plurality of first differential amplification circuits and the plurality of second differential amplification circuits are mutually connected in parallel between the pair of input-side transmission lines and the pair of output-side transmission lines.

The foregoing summary is illustrative only and is not intended to be in any way limiting. In addition to the illustrative aspects, exemplary embodiments, and features described above, further aspects, exemplary embodiments, and features will be become apparent by reference to the drawing and the following detailed description.

BRIEF DESCRIPTION OF THE DRAWINGS

FIG. 8 is a schematic diagram of the driving circuit according to the exemplary embodiment;

FIG. 13 is mathematical formulas for explaining that a common-mode component is reduced in an output signal of the driving circuit according to the exemplary embodiment;

DETAILED DESCRIPTION

Figure 1:
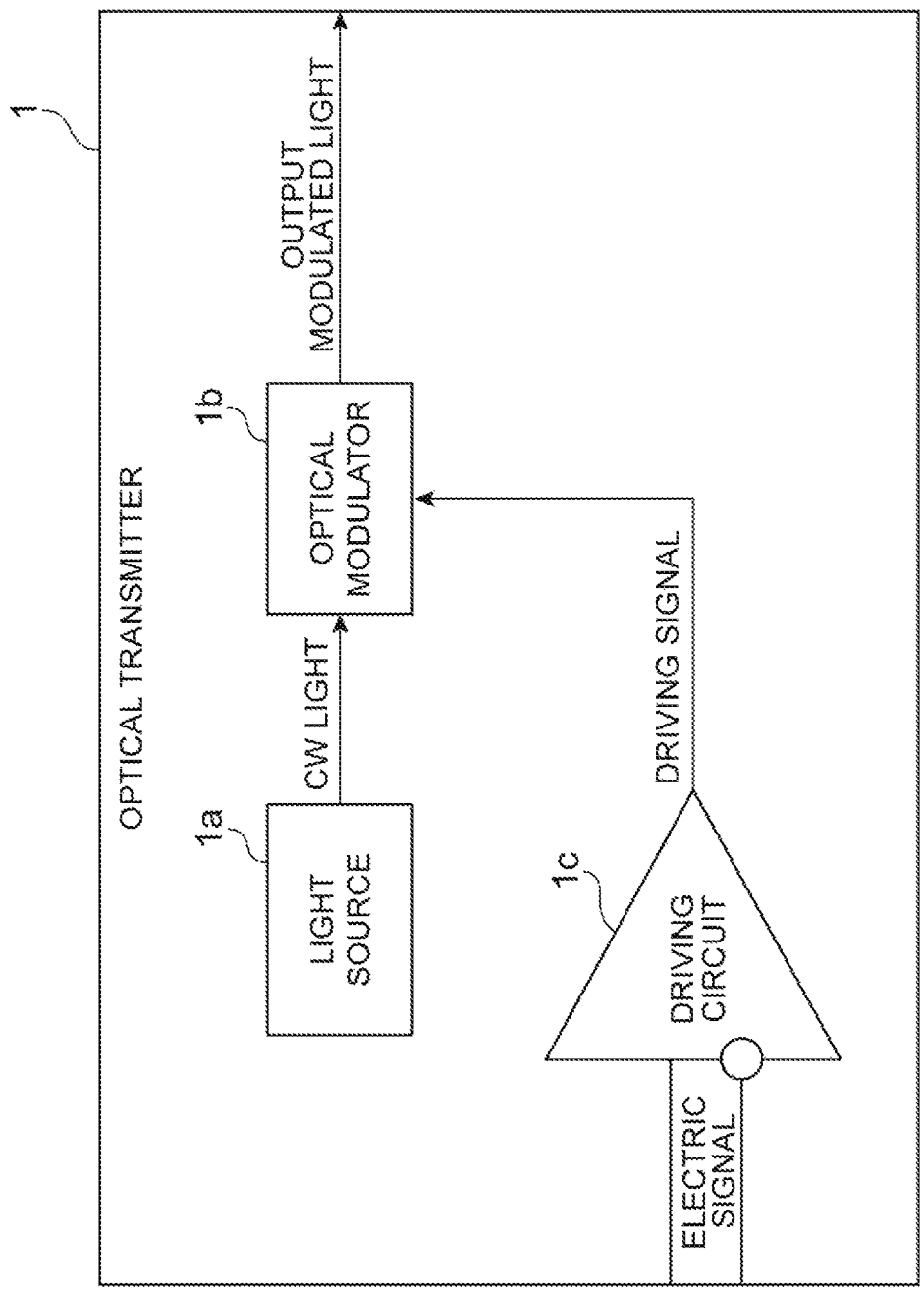
FIG. 1 is a schematic diagram of a configuration of an optical transmitter, in which a driving circuit for an optical modulator according to an exemplary embodiment is used.

In the following description, reference is made to the accompanying drawings, which form a part hereof. The Exemplary embodiments described in the detailed description, drawing, and claims are not meant to be limiting. Other exemplary embodiments may be utilized, and other changes may be made, without departing from the spirit or scope of the subject matter presented here.

A specific example of a driving circuit according to an exemplary embodiment of the present disclosure will be described below with reference to the drawings. It should be noted that the present invention is not limited to the exemplary embodiment. It is intended that the present invention is described in the claims and includes all variations within the claims and their equivalents. In the description of the drawings, if possible, identical reference numerals are assigned to identical elements, and duplicated description thereof is omitted.

FIG. 1 is a schematic diagram of a configuration of an optical transmitter, in which a driving circuit according to the exemplary embodiment is used. An optical transmitter 1 illustrated in FIG. 1 includes a light source 1a, an optical modulator 1b, and a driving circuit 1c according to the exemplary embodiment. The light source 1a outputs CW light. The driving circuit 1c drives the optical modulator 1b. The optical modulator 1b modulates the CW light.

Figure 9:
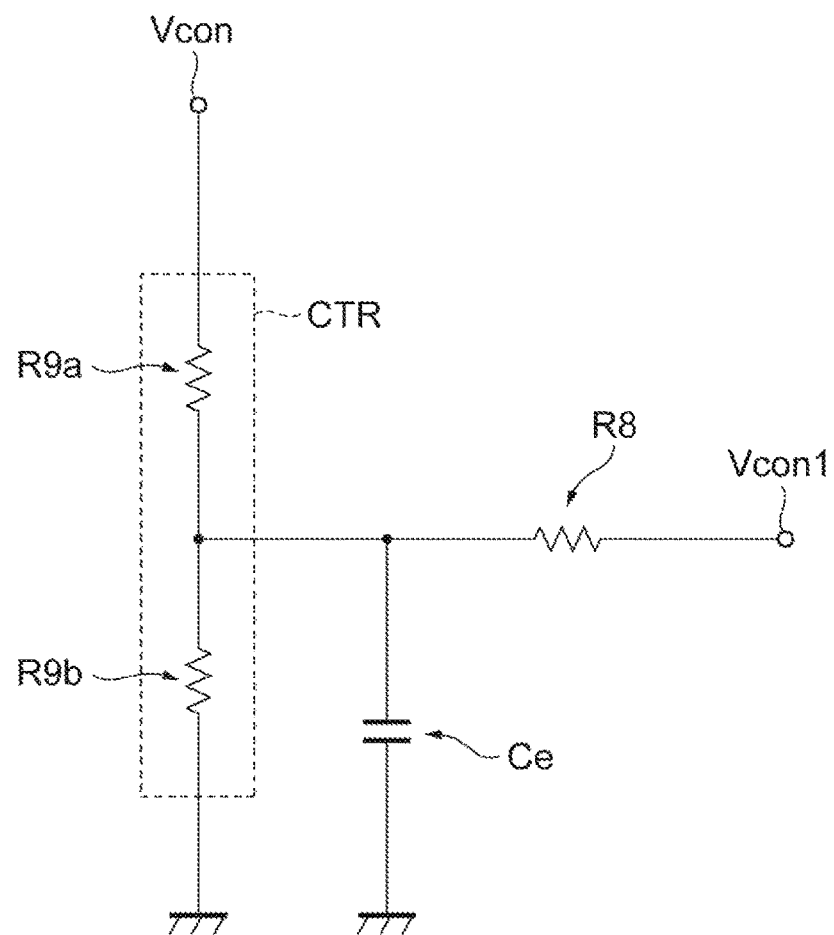
FIG. 9 is a circuit diagram illustrating an example of a voltage circuit in FIG. 8 according to the exemplary embodiment.
Figure 10:
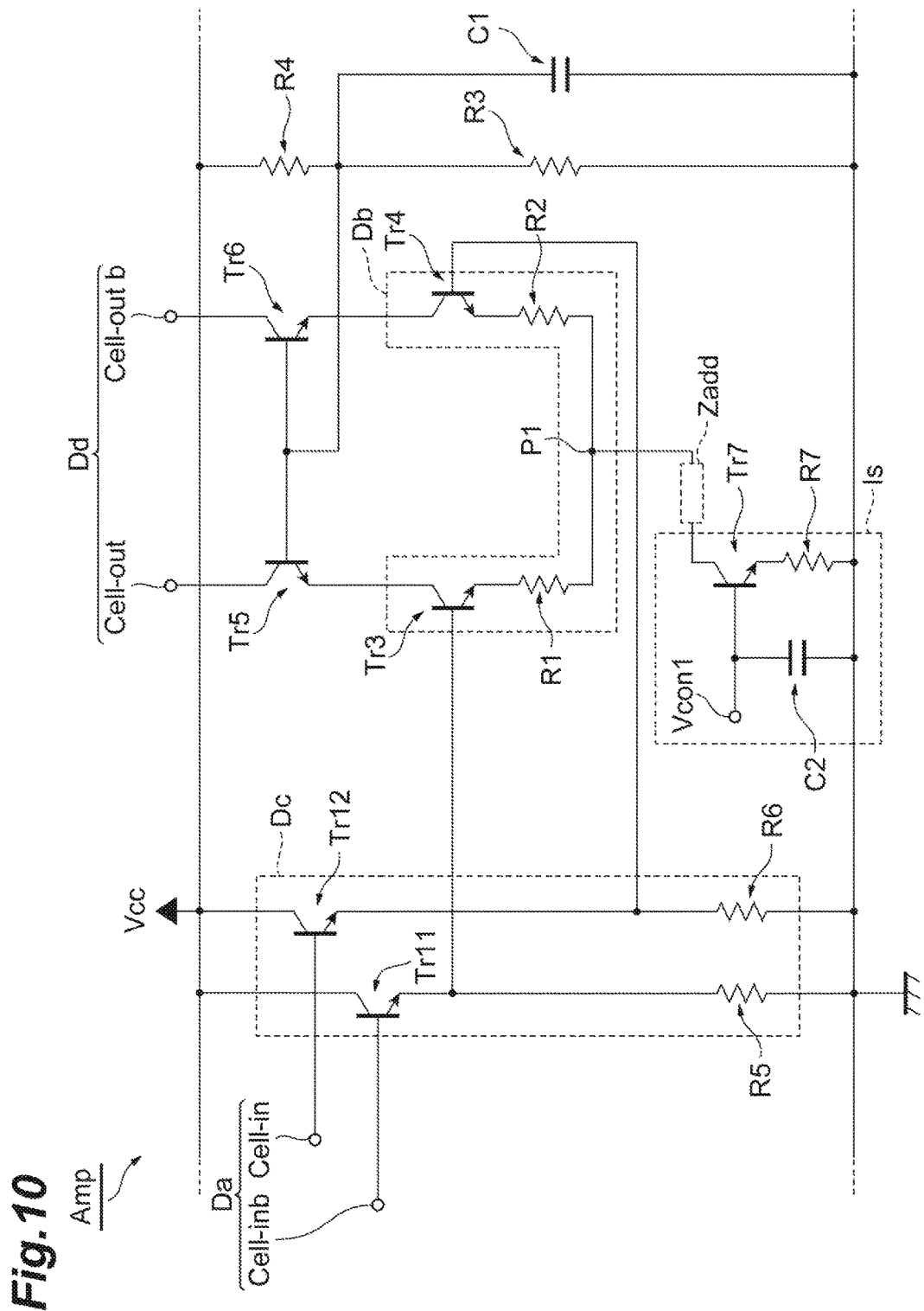
FIG. 10 is a circuit diagram illustrating an example of a cell amplification circuit (the differential amplification circuit) according to the exemplary embodiment.

FIG. 8 is a diagram schematically illustrating a driving circuit 100 according to the exemplary embodiment. FIG. 9 is a circuit diagram illustrating an example of a voltage circuit CTR (a current adjustment circuit) in FIG. 8. FIG. 10 is a circuit diagram illustrating an example of a cell amplification circuit (a differential amplification circuit) Amp according to the exemplary embodiment.

The driving circuit 100 in FIG. 8 is configured to include a traveling wave amplification (TWA) circuit. The driving circuit 100 includes differential input terminals Din, Dinb, input-side transmission lines Lin1, Lin2, Lin3, Lin4, Linb1, Linb2, Linb3, Linb4, input-side termination resistors Re3, Re4, cell amplification circuits Amp connected in parallel to each other, output-side transmission lines Lout0, Lout1, Lout2, Lout3, Loutb0, Loutb1, Loutb2, Loutb3, output-side termination resistors Re1, Re2, and differential output terminals Dout, Doutb.

Each of the cell amplification circuits Amp is a differential amplification circuit. The differential amplification circuit to be used as the cell amplification circuit Amp is, for example, the differential amplification circuit illustrated in the circuit diagram of FIG. 10. An example of the driving circuit 100 illustrated in FIG. 8 has four cell amplification circuits Amp. Each cell amplification circuit (differential amplification circuit) Amp in the driving circuit 100 includes a pair of input terminals and a pair of output terminals. Two types of circuits having different internal configurations are used for the plurality of cell amplification circuits (differential amplification circuits) Amp. For example, one type of circuit is used for the two cell amplification circuits, and another type thereof is used for the other two cell amplification circuits. Details will be described below.

The differential input terminals Din, Dinb receive a differential input signal from outside. The differential input terminals Din, Dinb include a positive-phase input terminal Din for inputting a positive-phase component of the differential input signal (a positive-phase input signal) and a negative-phase input terminal Dinb for inputting a negative-phase component of the differential input signal (a negative-phase input signal), respectively. In other words, the positive-phase input terminal Din receives the positive-phase input signal, and at the same time, the negative-phase input terminal Dinb receives the negative-phase input signal. The positive-phase input signal and negative-phase input signal constitutes a differential input signal. The positive-phase input signal has a phase different from a phase of the negative-phase input signal by 180° (hereinafter referred to as a negative phase). Namely, the negative phase is different from the positive phase by 180°.

Amplitude of the positive-phase input signal is substantially identical to amplitude of the negative-phase input signal. Further, the normal-phase input signal and the reverse-phase input signal are a pair of complementary signals to each other. For example, the negative-phase input signal decreases when the positive-phase input signal increases, and the negative-phase input signal increases when the positive-phase input signal decreases. When the positive-phase input signal reaches a peak value (a maximum value), the negative-phase input signal reaches a bottom value (a minimum value). When the positive-phase input signal reaches the bottom value (the minimum value), the negative-phase input signal reaches the peak value (the maximum value).

The input-side transmission lines Lin1 to Lin4 are connected in cascade in this order, and constitute one transmission line having, for example, a characteristic impedance of 50 [Ω].

The input-side transmission line Lin1 is connected to the positive-phase input terminal Din at one end opposite to another end connected to the input-side transmission line Lin2 The input-side transmission line Lin4 is connected to one end of the input-side termination resistor Re3 at another end opposite to one end connected to the input-side transmission line Lin3. Another end of the input-side termination resistor Re3 is grounded. Further, the input-side transmission lines Linb1 to Linb4 are connected in cascade in this order, and constitute one transmission line having, for example, a characteristic impedance of 50 [Ω].

The input-side transmission line Linb1 is connected to the negative-phase input terminal Dinb at one end opposite to another end connected to the input-side transmission line Linb2. The input-side transmission line Linb4 is connected to one end of the input-side termination resistor Re4 at another end opposite to one end connected to the input-side transmission line Linb3. Another end of the input-side termination resistor Re4 is grounded. The input-side transmission lines Lin1 to Lin4 transmit the positive-phase input signal input to the positive-phase input terminal Din toward the input-side termination resistor Re3.

Similarly, the input-side transmission lines Linb1 to Linb4 transmit the negative-phase input signal input to the negative-phase input terminal Dinb toward the input-side termination resistor Re4. In this way, the input-side transmission lines Lin1 to Lin4 and the input-side transmission lines Linb1 to Linb4 respectively transmit, as a pair of transmission lines, the differential input signal received by the differential input terminals Din and Dinb from the outside toward the input-side termination resistors Re3 and Re4. At this time, it is preferable that an input-side transmission line LinL, which is L-th (L is 1 to 4) from the input terminal Din, have a characteristic impedance and a delay time identical to a characteristic impedance and a delay time of an input-side transmission line LinbL, which is L-th from the input terminal Dinb.

The output-side transmission lines Lout0 to Lout3 are connected in cascade in this order, and constitute one transmission line having, for example, a characteristic impedance of 50 [Ω]. The output-side transmission line Lout0 is connected to one end of the output-side termination resistor Re2 at one end opposite to another end connected to the output-side transmission line Lout1. The output-side transmission line Lout3 is connected to the –phase output terminal Dout at one end opposite to another end connected to the output-side transmission line Lout2.

Further, the output-side transmission lines Loutb0 to Loutb3 are connected in cascade in this order, and constitute one transmission line having, for example, a characteristic impedance of 50 [Ω]. The output-side transmission line Loutb0 is connected to one end of the output-side termination resistor Re1 at one end opposite to another end connected to the output-side transmission line Loutb1. The output-side transmission line Loutb3 is connected to the negative-phase output terminal Doutb at another end opposite to one end connected to the output-side transmission line Loutb2. Another end of each output-side termination resistors Re1, Re2 is connected to a power supply Vcc via a power line.

The cell amplification circuits Amp are connected in parallel to each other between the input-side transmission lines Lin1 to Lin4, Linb1 to Linb4 and the output-side transmission lines Lout0 to Lout3, Loutb0 to Loutb3. More specifically, one of the two input terminals (a non-inverting input terminal) of each cell amplification circuit Amp is connected to the one transmission line configured by the input-side transmission lines Lin1 to Lin4. Another of the two input terminals (an inverting input terminal) of each cell amplification circuit Amp is connected to the one transmission line configured by the input-side transmission lines Linb1 to Linb4.

Further, one of the two output terminals (a non-inverting output terminal) of each cell amplification circuit Amp is connected to the one transmission line configured by the output-side transmission lines Lout0 to Lout3. Another of the two output terminals (an inverting output terminal) of each cell amplification circuit Amp is connected to the one transmission line configured by the output-side transmission lines Loutb0 to Loutb3.

Accordingly, the pair of input terminals of each cell amplification circuit Amp receives the differential input signal transmitted by the input-side transmission lines Lin1 to Lin4 and the input-side transmission lines Linb1 to Linb4. Each cell amplification circuit Amp amplifies the differential input signal received from the one transmission line configured by the input-side transmission lines Lin1 to Lin4 and the one transmission line configured by the input-side transmission lines Linb1 to Linb4, and outputs an amplified differential input signal from the pair of output terminals to the one transmission line configured by the output-side transmission lines Lout0 to Lout3 and the one transmission line configured by the input-side transmission lines Linb1 to Linb4 as a differential signal.

A pair of output-side transmission lines (the one transmission line configured by the output-side transmission lines Lout0 to Lout3, the one transmission line configured by the output-side transmission lines Loutb0 to Loutb3) transmits differential signals output from the pair of output terminals of each cell amplification circuit Amp. Delay times of the differential signals amplified by the cell amplification circuits Amp are equal to each other. In other words, the delay times each ranging from a time at which the pair of input terminals of each amplification circuit Amp receives the differential input signal to a time at which the pair of output terminals thereof outputs the differential signals corresponding to the differential input signal are substantially equal.

The input-side transmission lines Lin1 to Lin4 and the non-inverting input terminals of the cell amplification circuits Amp are connected so that inductances of the input-side transmission lines Lin1 to Lin4 and input capacitances of the cell amplification circuits Amp (for example, each cell amplification circuit Amp has 20 [fF] as input capacitance) constitute a distributed constant circuit (an input-side transmission line including the input capacitances of the non-inverting input terminals). The input-side transmission lines Linb1 to Linb4 and the inverting input terminals of the cell amplification circuits Amp are connected so that inductances of the input-side transmission lines Linb1 to Linb4 and input capacitances of the cell amplification circuits Amp constitute a distributed constant circuit (an input-side transmission line including the input capacitances of the inverting input terminals).

The distributed constant circuit formed by the inductances and the input capacitances (LC circuits) can be used to determine electrical characteristics, such as a characteristic impedance and a delay time, of the transmission line as an equivalent circuit of each of the one transmission line configured by the input-side transmission lines Lin1 to Lin4 and the one transmission line configured by the input-side transmission lines Linb1 to Linb4.

The output-side transmission lines Lout0 to Lout3 and the non-inverting output terminals of the cell amplification circuits Amp are connected so that inductances of the output-side transmission lines Lout0 to Lout3 and output capacitances of the cell amplification circuits Amp (for example, each cell amplification circuit Amp has 20 [fF] as output capacitance) constitute a distributed constant circuit (an output-side transmission line including the output capacitances of the non-inverting output terminals). The output-side transmission lines Loutb0 to Loutb3 and the inverting output terminals of the cell amplification circuits Amp are connected so that inductances of the output-side transmission lines Loutb0 to Loutb3 and output capacitances of the cell amplification circuits Amp constitute a distributed constant circuit (an output-side transmission line including the output capacitances of the inverting output terminals)

The distributed constant circuit formed by the inductances and the output capacitances can be used to determine electrical characteristics, such as a characteristic impedance and a delay time, of the transmission line as an equivalent circuit of each of the one transmission line configured by the output-side transmission lines Lout0 to Lout3 and the one transmission line configured by the output-side transmission lines Loutb0 to Loutb3.

The delay times of the respective transmission lines Lin1 to Lin4, Linb1 to Linb4, Lout0 to Lout3, and Loutb0 to Loutb3 are designed so that the delay time of the input-side transmission line is identical to the delay time of the output-side transmission line corresponding thereto. In other words, the delay time of Lin1 is equal to the delay time of Lout1, and the delay time of Linb1 is equal to the delay time of Loutb1. The delay time of Lin2 is equal to the delay time of Lout2, and the delay time of Linb2 is equal to the delay time of Loutb2. The delay time of Lin3 is equal to the delay time of Lout3, and the delay time of Linb3 and the delay time of Loutb3 are equal to each other.

For example, the non-inverting input terminal of the first input-side one of the cell amplification circuits Amp is connected to between the positive-phase input terminal Din and the input-side transmission line Lin1. The non-inverting input terminal of the second input-side one of the cell amplification circuits Amp is connected to between the input-side transmission line Lin1 and the input-side transmission line Lin2. The non-inverting input terminal of the third input-side one of the cell amplification circuits Amp is connected to between the input-side transmission line Lin2 and the input-side transmission line Lin3. The non-inverting input terminal of the fourth input-side one of the cell amplification circuits Amp is connected to between the input-side transmission line Lin3 and the input-side transmission line Lin4. For example, the inverting input terminal of the first input-side one of the cell amplification circuits Amp is connected to between the negative-phase input terminal Dinb and the input-side transmission line Linb1. The inverting input terminal of the second input-side one of the cell amplification circuits Amp is connected to between the input-side transmission line Linb1 and the input-side transmission line Linb2. The inverting input terminal of the third input-side one of the cell amplification circuits Amp is connected to between the input-side transmission line Linb2 and the input-side transmission line Linb3. The inverting input terminal of the fourth input-side one of the cell amplification circuits Amp is connected to between the input-side transmission line Linb3 and the input-side transmission line Linb4.

For example, the non-inverting output terminal of the first input-side one of the cell amplification circuits Amp is connected to between the output-side transmission line Lout0 and the output-side transmission line Lout1. The non-inverting output terminal of the second input-side one of the cell amplification circuits Amp is connected to between the output-side transmission line Lout1 and the output-side transmission line Lout2. The non-inverting output terminal of the third input-side one of the cell amplification circuits Amp is connected to between the output-side transmission line Lout2 and the output-side transmission line Lout3. The non-inverting output terminal of the fourth input-side one of the cell amplification circuits Amp is connected to between the output-side transmission line Lout3 and the normal-phase output terminal Dout. For example, the inverting output terminal of the first input-side one of the cell amplification circuits Amp is connected to between the output-side transmission line Loutb0 and the output-side transmission line Loutb1. The inverting output terminal of the second input-side one of the cell amplification circuits Amp is connected to between the output-side transmission line Loutb1 and the output-side transmission line Loutb2. The inverting output terminal of the third input-side one of the cell amplification circuits Amp is connected to between the output-side transmission line Loutb2 and the output-side transmission line Loutb3. The inverting output terminal of the fourth input-side one of the cell amplification circuits Amp is connected to between the output-side transmission line Loutb3 and the reverse-phase output terminal Doutb.

The plurality of cell amplification circuits, the input-side transmission lines, and the output-side transmission lines are connected as described above, and the delay time of each cell amplification circuit and the delay time of each transmission line are adjusted in this way. Accordingly, the differential input signal input to the positive-phase input terminal Din and the negative-phase input terminal Dinb is amplified by passing through the plurality of cell amplification circuits Amp at different phases (timing) having a constant interval therebetween. After that, the amplified differential input signals are superposed with the same phase at the positive-phase output terminal Dout and the negative-phase output terminal Doutb.

As illustrated in FIG. 8, the driving circuit 100 further includes the voltage circuit CTR, a capacitor Ce, and a resistive element R8 (a third resistor). The voltage circuit (a voltage adjustment circuit) CTR of the driving circuit 100 in FIG. 8 includes a resistive element R9a and a resistive element R9b, as illustrated in FIG. 9, for example. The resistive element R9a and the resistive element R9b are connected in series in the voltage circuit CTR. One end of the resistive element R9a is connected to a voltage terminal Vcon. Another end of the resistive element R9a is connected to one end of the resistive element R9b, one end of the capacitor Ce, and one end of the resistive element R8.

Another end of the resistive element R9b is grounded via a line for grounding (a ground line). Another end of the capacitor Ce is grounded via a ground line. Another end of the resistive element R8 is commonly connected to a terminal Vcon1 of a current source Is of each cell amplification circuit Amp. The voltage circuit CTR constitutes a so-called resistance voltage dividing circuit by the resistive element R9a and the resistive element R9b. In the voltage circuit CTR, a value of a control voltage applied to the current source Is can be adjusted by changing a ratio of a resistance value of each of the resistive element R9a and the resistive element R9b to a voltage applied to the voltage terminal Vcon.

In this way, the voltage applied to the voltage terminal Vcon is divided by the resistive element R9a and the resistive element R9b, and is further stabilized by the capacitor Ce so that the voltage is kept at a constant value. It should be noted that the voltage circuit CTR may be a circuit other than the above-described voltage dividing circuit as long as the control voltage applied to the terminal Vcon1 can be generated from the voltage applied to the voltage terminal Vcon.

The current sources Is of the plurality of differential amplification circuits Amp included in the driving circuit 100 are mutually connected in parallel to the voltage circuit CTR via the resistive element R8. The voltage circuit CTR generates a control voltage for adjusting a current generated by the current source Is (a current supplied by the current source Is). The voltage circuit CTR applies this control voltage to the terminal Vcon1 of the current source Is of each cell amplification circuit Amp via the resistive element R8. In other words, the control voltage generated by the voltage circuit CTR is applied to the terminal Vcon1 of the current source Is of each cell amplification circuit Amp via one resistive element R8. In this way, the current sources Is of the plurality of cell amplification circuits Amp commonly receive the control voltage generated by the voltage circuit CTR from the voltage circuit CTR via one resistive element R8.

Herein, for example, parasitic reactance held by the terminal Vcon1 of the current source Is is 1 [nH], and a capacitance of the capacitor C2 of the current source Is is 0.5 [pF]. In this case, regarding frequency components of 10 [GHz] or less of a signal input to a cell amplification circuit (a differential amplification circuit) Amp located, for example, closest to the positive-phase input terminal Din and the negative-phase input terminal Dinb (hereinafter referred to as a cell amplification circuit Amp1) among the plurality of differential amplification circuits Amp of the driving circuit 100, a common-mode signal Se1 passed through a capacitance Cbc of the current source Is of the cell amplification circuit Amp1 is propagated to the terminal Vcon1 of the differential amplification circuit Amp1.

The common-mode signal Se1 is a voltage signal. This common-mode signal Se1 passes through the resistive element R8 having the resistance value (a common impedance), and is input to the current sources Is of all of the differential amplification circuits Amp except the differential amplification circuit Amp1 via the terminals Vcon1. A common-mode signal Se2 corresponding to the common-mode signal Se1 is output to the differential output terminal Dout and the differential output terminal Doutb from all of the other differential amplification circuits Amp.

As described above, since the plurality of cell amplification circuits Amp is connected in parallel to one transmission line configured by the output-side transmission lines Lout0 to Lout3 and one transmission line configured by the output-side transmission lines Loutb0 to Loutb3, the common-mode signals Se2 output from the cell amplification circuits Amp are superposed on each other, and are output to the differential output terminal Dout and the differential output terminal Doutb. When the plurality of common-mode signals Se2 output from all of the other differential amplification circuits Amp is transmitted on the output-side transmission lines, the delay times of the transmission lines do not coincide with each other. Accordingly, the phases do not coincide with each other at the positive-phase output terminal Dout and the negative-phase output terminal Doutb.

Moreover, the plurality of common-mode signals Se2 has a phase different from a phase of the common-mode signal output from the differential amplification circuit Amp1 to the output-side transmission line Lout1 and the output-side transmission line Loutb1 at the positive-phase output terminal Dout and the negative-phase output terminal Doutb. Therefore, the phase of the plurality of common-mode signals Se2 and the phase of the common-mode signal output from the differential amplification circuit Amp1 to the output-side transmission line Lout1 and the output-side transmission line Loutb1 do not coincide with each other. Since the phases are canceled by each other at the positive-phase output terminal Dout and the negative-phase output terminal Doutb, the common-mode signal output from the driving circuit 100 can be reduced.

Figure 2:
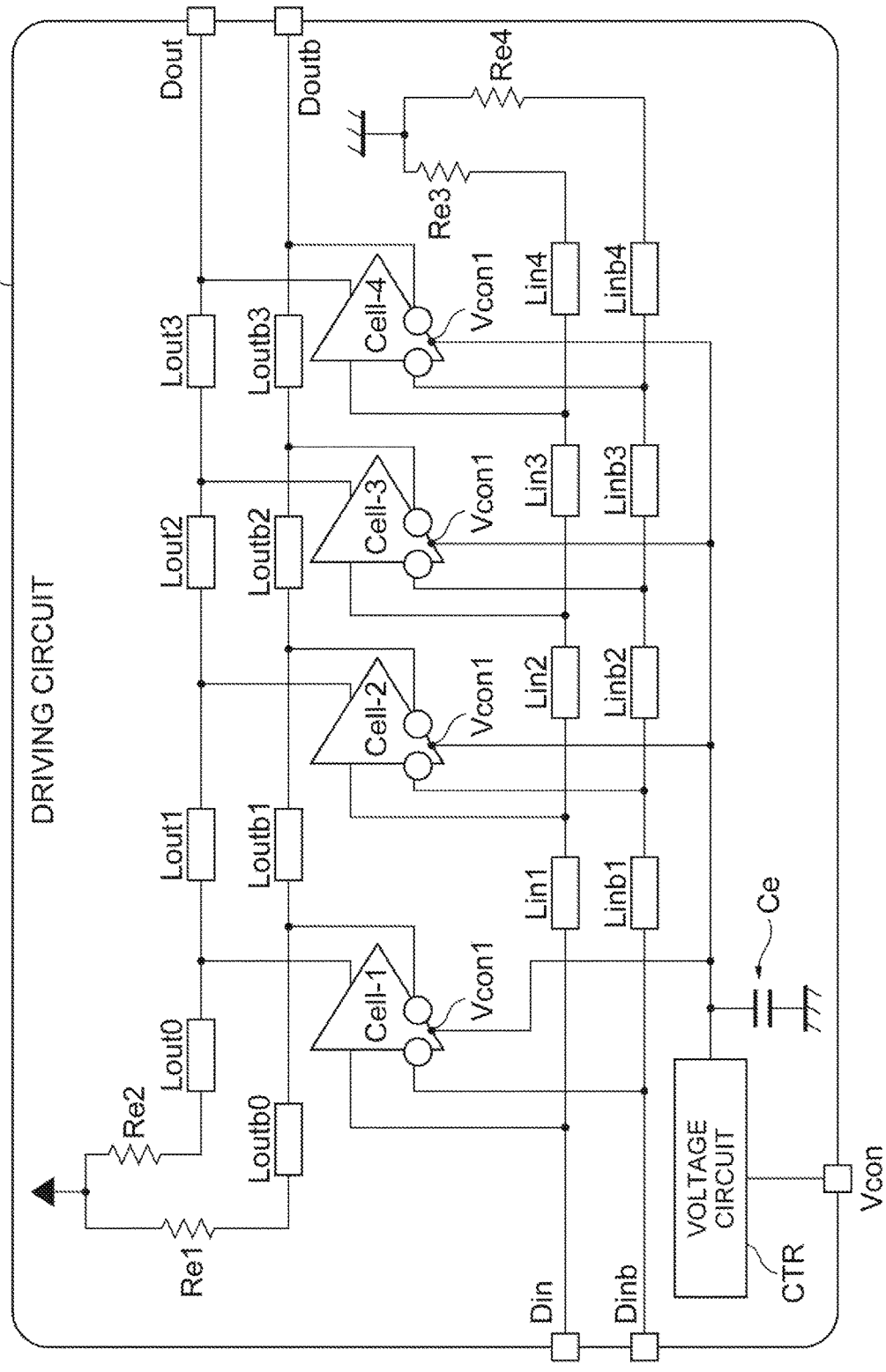
FIG. 2 is a schematic diagram of a driving circuit in a comparative example.

A driving circuit in a comparative example is described herein to explain a reducing effect of the common-mode signal. FIG. 2 is a schematic diagram of a driving circuit 1c in the comparative example. The driving circuit 1c in the comparative example is different from the driving circuit 100 according to the exemplary embodiment in that a plurality of cell amplification circuits Cell-1 to Cell-4 is used instead of the plurality of cell amplification circuits Amp and that the resistive element R8 is not included. The plurality of cell amplification circuits Cell-1 to Cell-4 becomes an identical differential amplification circuit.

In a multi-level modulation system, such as pulse amplitude modulation (PAM)-4 (further, PAM-8 or the like) or 16 QAM, using the driving circuit (the traveling wave amplifier) illustrated in FIG. 8, 2N (N =2, 3, 4, ...) logic levels are provided in an amplitude direction of a communication signal. It is preferable that intervals between adjacent logic levels be uniform to suppress an identification error of each logic level. Accordingly, the driving circuit is needed to perform a linear amplification.

Figure 3:
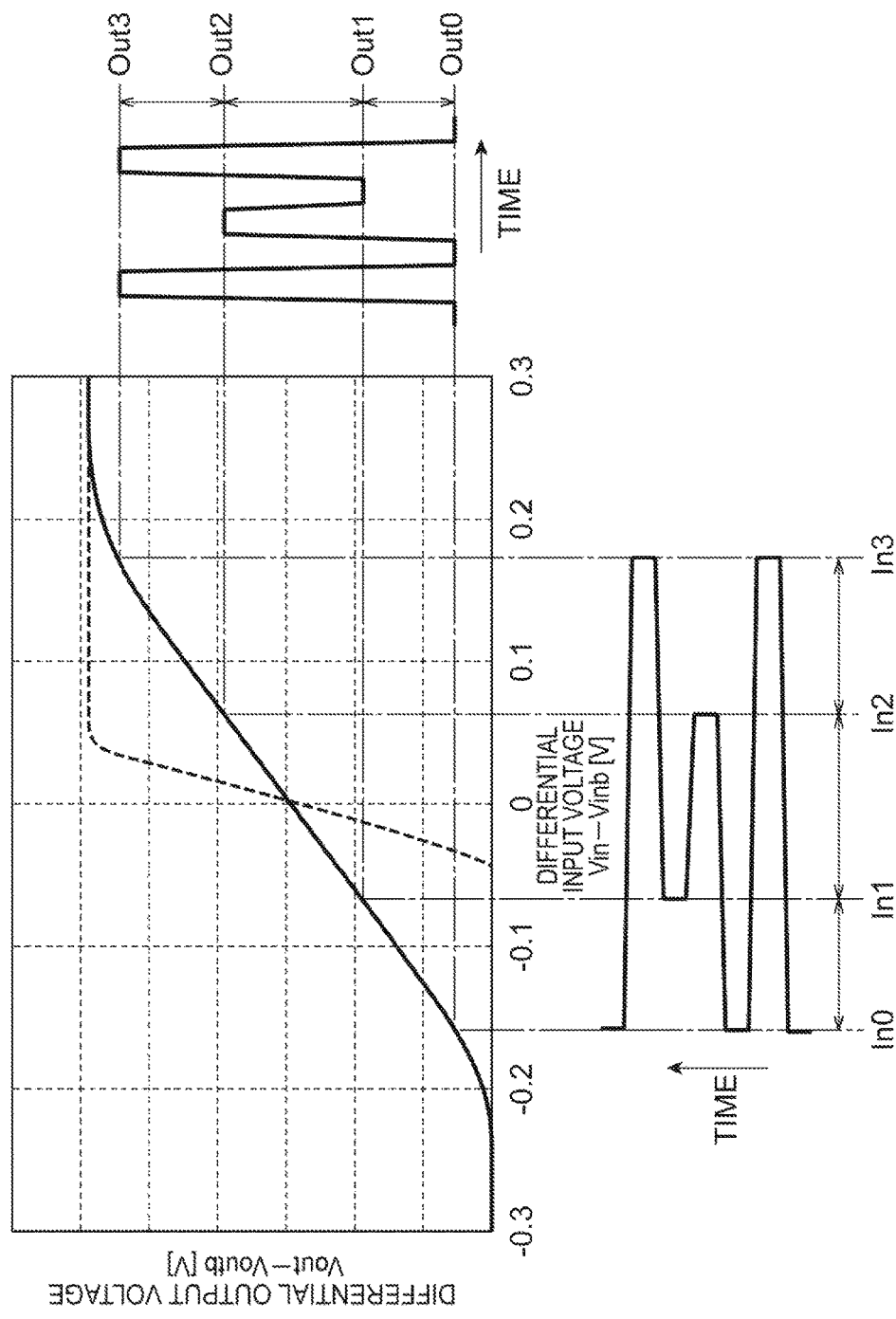
FIG. 3 is a graph for explaining a linear amplification of the driving circuit.

In other words, for example, in FIG. 3 (a case of a PAM-4 signal), a differential input voltage Vin−Vinb [V] (a horizontal axis) and a differential output voltage Vout−Voutb [V] (a vertical axis) have four logic levels (inputs In0 to In3, outputs Out0 to Out3), respectively. When a portion of a curve that is upward to the right (a slope $\Delta$(Vout−Voutb)/$\Delta$ (Vin−Vinb) corresponding to a voltage gain) forms a line shape (a straight line) with respect to a voltage range of an input signal, each logic level is transmitted to an output signal at an equal ratio. As the portion is deviated from the line region (just including the straight line), the ratio becomes ununiform depending on the logic level, and the output signal is distorted.

In order to perform the linear amplification (or to keep linearlity), the voltage gain of the differential amplification circuit is set smaller than a case of a saturated operation (a broken line). It should be noted that FIG. 3 illustrates a static characteristic. However, since an actual modulation is performed by a high-speed pulse signal, it is preferable that a frequency characteristic of the voltage gain be flat in predetermined frequencies. In other words, it is preferable that the slope of the portion that is upward to the right (the voltage gain) in FIG. 3 be constant and not fluctuate by the frequency of the input signal.

Herein, Vin [V] indicates a positive-phase input voltage input to a positive-phase input terminal Din, and Vinb [V] indicates a negative-phase input voltage input to a negative-phase input terminal Dinb. The positive-phase input voltage Vin [V] and the negative-phase input voltage Vinb [V] are voltage signals having mutually opposite phases. Further, Vout [V] indicates a positive-phase output voltage output from a positive-phase output terminal Dout, and Voutb [V] indicates a negative-phase output voltage output from a negative-phase output terminal Doutb. The positive-phase output voltage Vout [V] and the negative-phase output voltage Voutb [V] are voltage signals having mutually opposite phases.

In the driving circuit 1c in the comparative example in FIG. 2, for example, when the voltage gain is reduced to allow the differential amplification circuit to perform the linear amplification, a common-mode reduction ratio (CMRR) [dB] is decreased in the high frequencies of 5 [GHz] or more, and jitters of an output signal waveform are increased, thereby increasing an identification error of an optical receiver. A larger value of the common-mode reduction ratio CMRR [dB] means a better characteristic.

Figure 4:
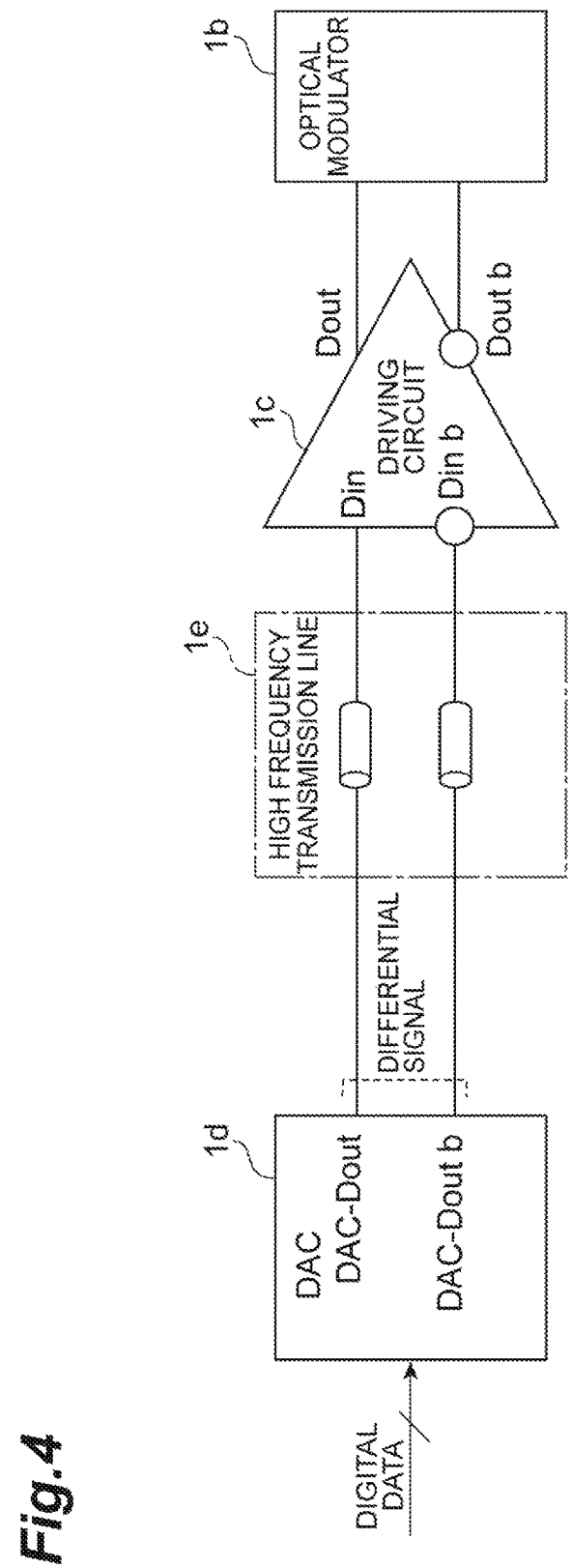
FIG. 4 is a diagram for explaining that a differential input signal of the driving circuit includes a common-mode component.

FIG. 4 is a block diagram of a transmission portion including a digital to analog converter (DAC) 1d to generate an input signal to the driving circuit. Differential signals DAC-Dout, DAC-Doutb output from the DAC 1d are multi-level amplitude modulation signals (for example, the above-described PAM-4 signals), and are input to the driving circuit 1c through a high frequency transmission line 1e.

It is preferable that the high frequency transmission line 1e form a transmission line having a predetermined characteristic impedance from an output terminal of the DAC to an input terminal of the driving circuit 1c. At this time, due to a delay time difference (skew) between a positive-phase signal (Vout [V]) side and a negative-phase signal (Voutb [V]) side of the high frequency transmission line 1e, and to a signal imbalance between the positive-phase signal DAC-Dout from a DAC positive-phase output terminal and the negative-phase signal DAC-Doutb from a DAC negative-phase output terminal, signals input to the driving circuit 1c include not only the differential signals but also common-mode signals as sub-components. The common-mode reduction ratio CMRR [dB] is expressed in the following formula (1);

$$CMRR = 20 \times \log_{10}(Ad/Ac) \ [dB] \quad (1)$$

wherein Ad [dB] represents a differential gain, and is a ratio of a differential component of an output voltage signal to a differential component of an input voltage signal. Further, Ac [dB] represents a common-mode gain, and is a ratio of a common-mode component of the output voltage signal to a common-mode component of the input voltage signal. Specifically, Ad=(Vout−Voutb)/(Vin−Vinb), and Ac=(Vout+Voutb)/(Vin+Vinb). In the TWA type driving circuit 1c, the common-mode reduction ratio CMRR [dB] mainly depends on an electrical characteristic of current sources of the cell amplification circuits (differential amplification circuits) Cell-1 to Cell-4 in the driving circuit 1c.

Figure 5:
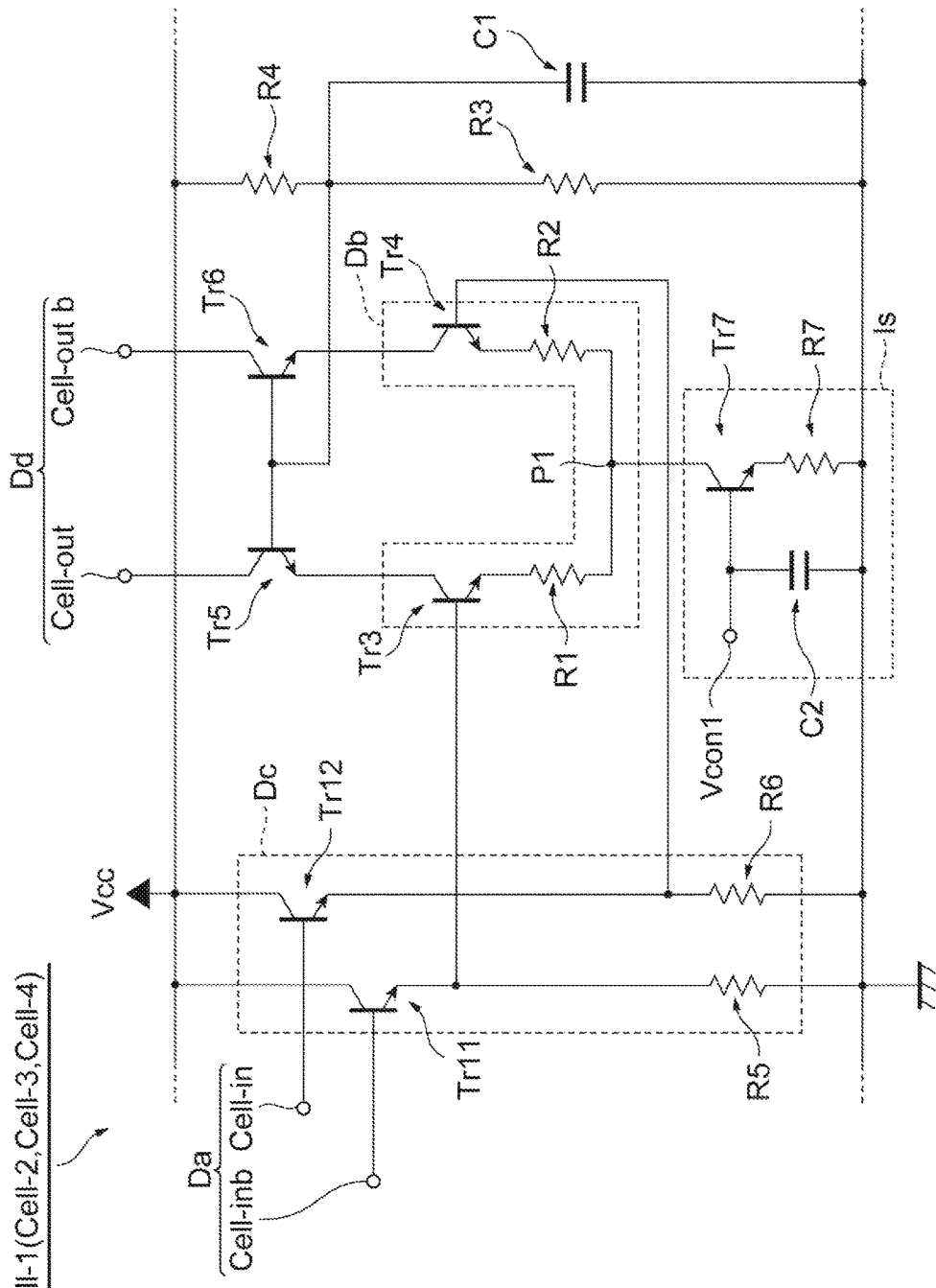
FIG. 5 is a schematic diagram of a differential amplification circuit according to the comparative example.

FIG. 5 illustrates an example of a circuit configuration of the cell amplification circuit of the driving circuit 1c in the comparative example illustrated in FIG. 2. The cell amplification circuit (herein, the differential amplification circuit) includes a differential input terminal Da, a differential pair circuit Db, an emitter-follower circuit Dc, two cascode-connected transistors Tr5, Tr6, a current source Is, and a differential output terminal Dd. The differential pair circuit Db includes a pair of transistors Tr3, Tr4 and resistors R1, R2. Emitters of the transistors Tr3, Tr4 are connected to each other via the resistors R1, R2. The emitter-follower circuit Dc drives the differential pair circuit Db. The two cascode-connected transistors Tr5, Tr6 are connected to collectors of the transistors Tr3, Tr4 of the differential pair circuit Db, respectively. Bases of the transistors Tr5, Tr6 are connected to each other.

The differential input terminal Da includes a positive-phase input terminal Cell-in and a negative-phase input terminal Cell-inb, and the differential output terminal Dd includes a positive-phase output terminal Cell-out and a negative-phase output terminal Cell-outb. The positive-phase input terminal Cell-in and the negative-phase input terminal Cell-inb correspond to the non-inverting input terminal and the inverting input terminal, respectively. The positive-phase output terminal Cell-out and the negative-phase output terminal Cell-outb correspond to the non-inverting output terminal and the inverting output terminal, respectively. The current source Is is connected to a connecting point P1 between the resistor R1 and the resistor R2 of the differential pair circuit Db to supply a current to the differential pair circuit Db. When the current source Is is configured with a transistor Tr7 illustrated in FIG. 5, the current source Is is represented by an equivalent circuit accompanied by parasitic components (a capacitance Cbc, an impedance Zc2) illustrated in FIG. 6. The parasitic components are caused by a configuration of the transistor Tr7. The capacitance Cbc corresponds to a parasitic capacitance between a base and a collector of the transistor Tr7.

Figure 6:
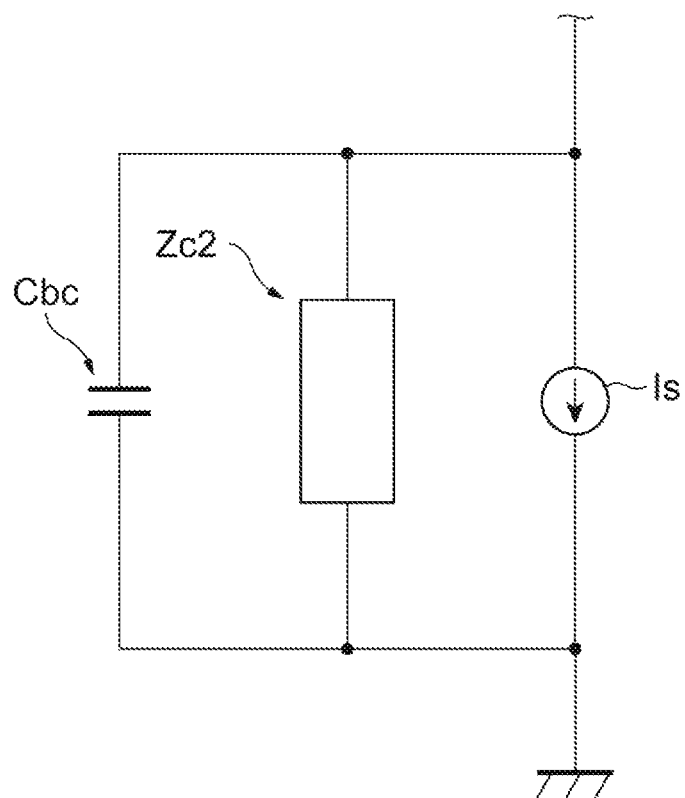
FIG. 6 is an equivalent circuit diagram of a current source of the differential amplification circuit in FIG. 5.

The impedance Zc2 is an impedance considering a feedback effect by mutual conductance Gin of the transistor Tr7 (a voltage/current gain ($\Delta Ice/\Delta Vbe$) of the transistor Tr7), and takes a low impedance value at high frequencies of about 20 [GHz] as compared with the capacitance Cbc. It should be noted that the current source Is in FIG. 6 represents an intrinsic current source based on the electrical characteristic of the transistor Tr7. A common-mode reduction ratio CMRR [dB] depends on a characteristic of the equivalent circuit of this current source Is.

Further, a voltage circuit CTR is connected to a terminal Vcon1 of the current source Is of each of the cell amplification circuits Cell-1 to Cell-4 of the driving circuit 1c in the comparative example. The voltage circuit CTR supplies a control voltage to the base of the transistor Tr7 and adjusts the current generated by the current source Is. The terminal Vcon1 of the current source Is is connected to the voltage circuit CTR, and is grounded via a capacitor Ce. The voltage circuit CTR generates a control voltage for adjusting the current source Is to input to the terminal Vcon1.

Figure 7A:
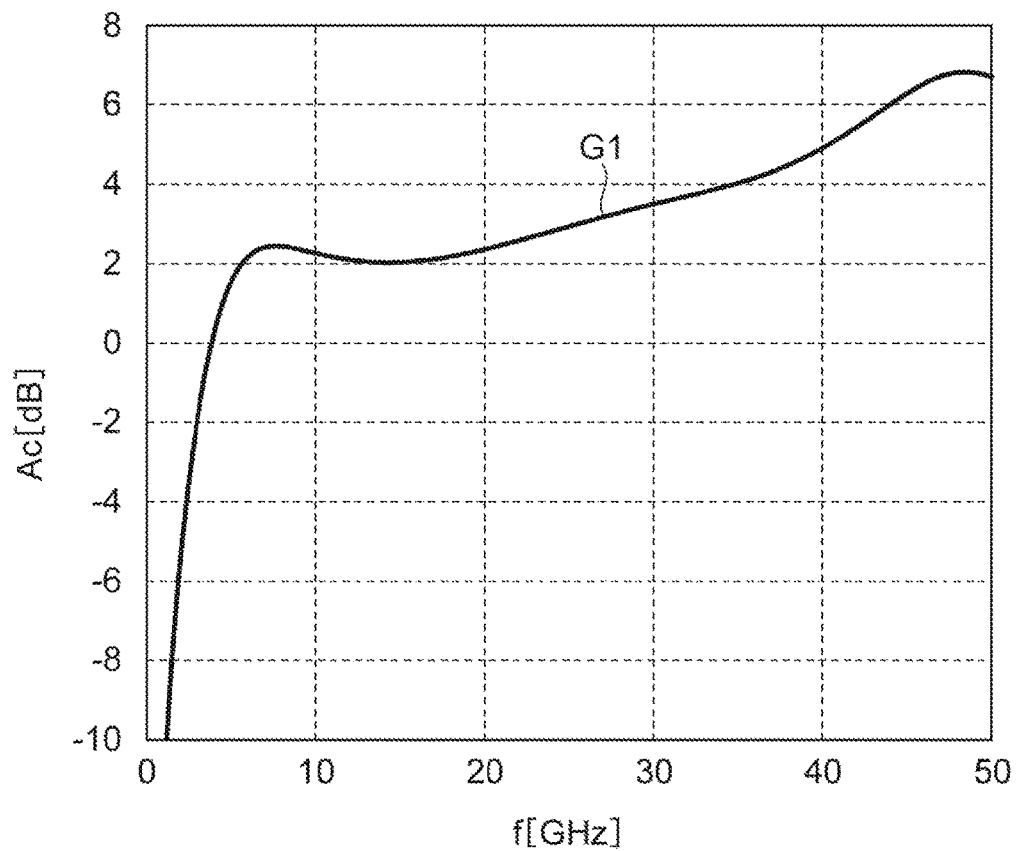
FIG. 7A is a graph illustrating a frequency characteristic of a common-mode gain of the driving circuit according to the comparative example.
Figure 7B:
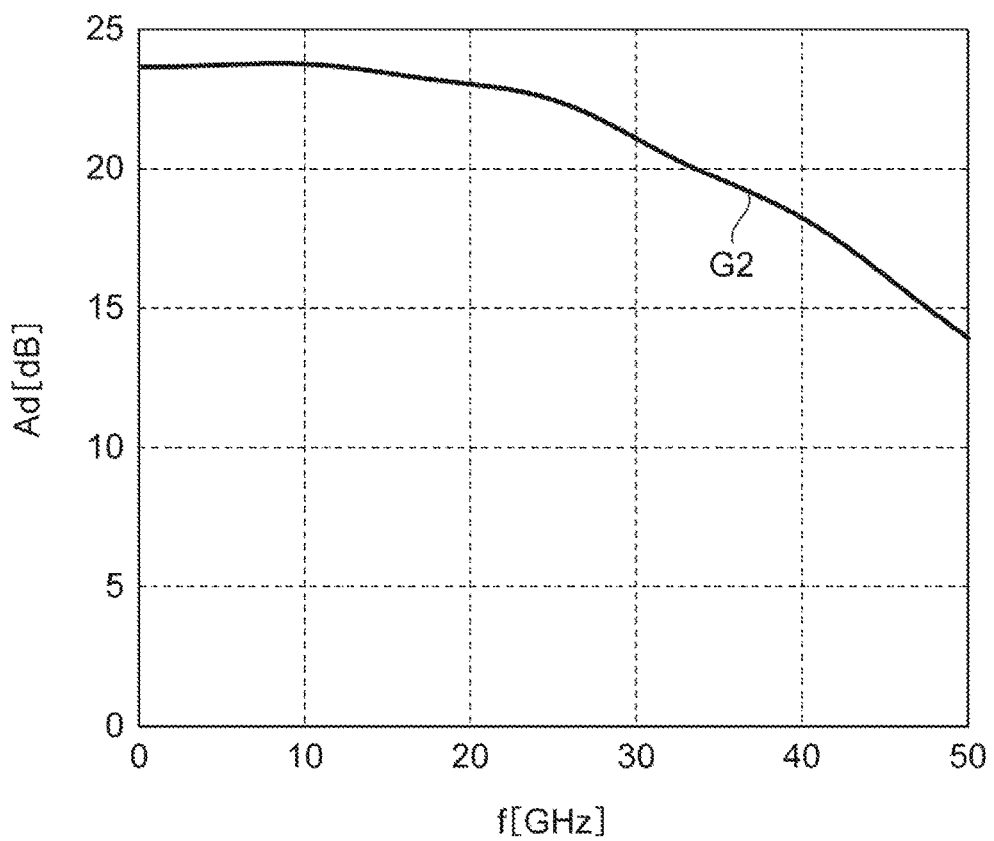
FIG. 7B is a graph illustrating a frequency characteristic of a differential gain of the driving circuit according to the comparative example.
Figure 7C:
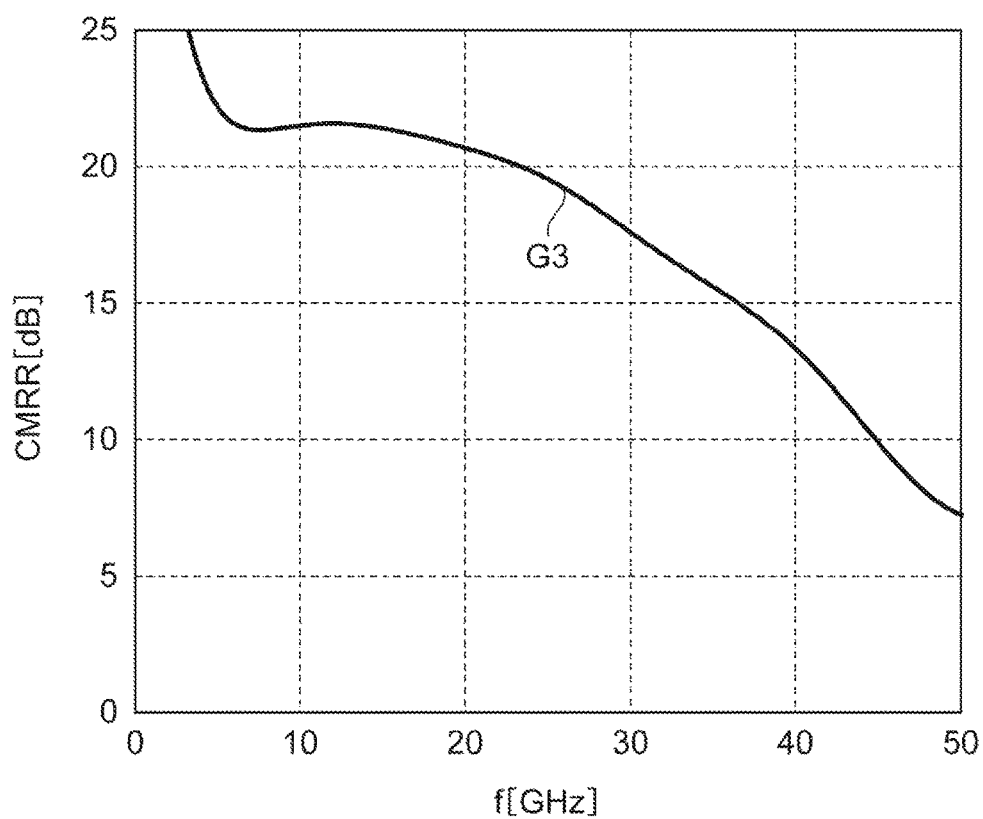
FIG. 7C is a graph illustrating a frequency characteristic of a common-mode rejection ratio of the driving circuit according to the comparative example.

FIGS. 7A to 7C illustrate simulation results of frequency characteristics (Ac, Ad, CMRR) of the driving circuit 1c in the comparative example using a linear amplification system. It should be noted that the results illustrated in FIGS. 7A to 7C are results obtained when the number of cell amplification circuits is eight in the configuration in FIG. 2. In FIG. 7A, a horizontal axis represents a frequency f [GHz] of an input signal, and a vertical axis represents a common-mode gain Ac of an output signal in a decibel [dB] (Ac is calculated as $20 \times \log_{10}$ (Ac) to represent in the decibel). In FIG. 7B, a horizontal axis represents the frequency f [GHz] of the input signal, and a vertical axis represents a differential gain Ad of the output signal in the decibel [dB] (Ad is calculated as $20 \times \log_{10}$ (Ad) to represent in the decibel).

In FIG. 7C, a horizontal axis represents the frequency f [GHz] of the input signal, and a vertical axis represents a common-mode reduction ratio CMRR [dB] obtained from the results illustrated in FIGS. 7A and 7B. In FIG. 7A, a curve G1 is a common-mode gain Ac [dB] obtained from the circuit configurations in FIGS. 2 and 5. In FIG. 7B, a curve G2 is a differential gain Ad [dB] obtained from the circuit configurations in FIGS. 2 and 5. In FIG. 7C, a curve G3 represents a common-mode reduction ratio CMRR [dB] calculated from the result illustrated in the curve G1 in FIG. 7A and the result illustrated in the curve G2 in FIG. 7B by using the formula (1).

The common-mode gain Ac [dB] depends on a collector impedance Z of the transistor Tr7 constituting the current source Is in FIG. 5. With reference to FIG. 7A, the common-mode gain Ac [dB] tends to rise overall with an increase in the frequency f of the input signal in a range in which the frequency f of the input signal is 5 [GHz] or more. With reference to FIG. 7B, the differential gain Ad [dB] decreases with the increase in the frequency f of the input signal. Moreover, with reference to FIG. 7C, the common-mode reduction ratio CMRR decreases with the increase in the frequency f of the input signal in the range in which the frequency f of the input signal is 5 [GHz] or more.

In this way, in a case of the driving circuit 1c in the comparative example, the common-mode signals from the positive-phase input terminal Din and the negative-phase input terminal Dinb pass through the differential amplification circuits Amp and reach the positive-phase output terminal Dout and the negative-phase output terminal Doutb without having a phase difference in the same way as the differential signal. Accordingly, a common-mode characteristic is worse, thereby decreasing the common-mode reduction ratio CMRR [dB].

Incidentally, the differential amplification circuit Amp located closest to the positive-phase input terminal Din and the negative-phase input terminal Dinb among the plurality of differential amplification circuits Amp of the driving circuit 100 according to the exemplary embodiment is referred to as the differential amplification circuit Amp1. In the same way as the differential amplification circuit Amp1, the common-mode signal Se2 can be generated even in the differential amplification circuits Amp of the driving circuit 100 other than the differential amplification circuit Amp1.

As illustrated in FIG. 10, the differential amplification circuit Amp includes a differential input terminal Da, a differential pair circuit Db, an emitter-follower circuit Dc, two cascade-connected transistors (transistors Tr5, Tr6), a current source Is, and a differential output terminal Dd. The emitter-follower circuit Dc drives the differential pair circuit Db. The two cascade-connected transistors Tr5, Tr6 are connected to the respective collectors of transistors Tr3, Tr4 included in the differential pair circuit Db. As described below, the differential amplification circuit Amp has two alternative circuits, that is, a circuit with a delay line Zadd (a transmission line) and a circuit without the delay line Zadd (the transmission line).

The differential input terminal Da includes a positive-phase input terminal Cell-in and a negative-phase input terminal Cell-inb, and the differential output terminal Dd includes a positive-phase output terminal Cell-out and a negative-phase output terminal Cell-outb. The positive-phase input terminal Cell-in and the negative-phase input terminal Cell-inb correspond to the non-inverting input terminal and the inverting input terminal, respectively. The positive-phase output terminal Cell-out and the negative-phase output terminal Cell-outb correspond to the non-inverting output terminal and the inverting output terminal, respectively. The positive-phase input signal and the negative-phase input signal are input to the positive-phase input terminal (the non-inverting input terminal) Cell-in and the negative-phase input terminal (the inverting input terminal) Cell-inb, respectively. As described above, the positive-phase input signal and the negative-phase input signal are paired complementary signals, and constitute one differential input signal. The positive-phase input signal has a phase different from a phase of the negative-phase input signal by 180[°]. The amplified differential input signals are output from the positive-phase output terminal (the non-inverting output terminal) Cell-out and the negative-phase output terminal (the inverting output terminal) Cell-outb, respectively, as differential output signals. In other words, the positive-phase output signal is output from the positive-phase output terminal, and the negative-phase output signal is output from the negative-phase output terminal As described above, the positive-phase output signal and the negative-phase output signal are paired complementary signals, and constitute one differential output signal. The positive-phase output signal has a phase different from a phase of the negative-phase output signal by 180[°]. A logical value of the differential output signal with respect to a logical value of the differential input signal (a positive logic or a negative logic) is determined by inversion or non-inversion of the amplification of the cell amplification circuit (the differential amplification circuit) according to the configuration of the optical transmitter, in which the driving circuit 100 is used. For example, when the non-inversion amplification is performed, the positive-phase output signal increases when the positive-phase input signal increases, and the positive-phase output signal decreases when the positive-phase input signal decreases (description of the negative-phase signal is omitted because it is obvious that the increase/decrease of the negative-phase signal is opposite to the increase/decrease of the positive-phase signal). Accordingly, the differential input signal and the differential output signal has an identical logical value.

Further, when the inversion amplification is performed, the positive-phase output signal decreases when the positive-phase input signal increases, and the positive-phase output signal increases when the positive-phase input signal decreases. In other words, for example, when the differential output signal is output with respect to the differential input signal as illustrated in FIG. 3, the differential amplification circuit performs the non-inversion amplification. If the differential input signal is a positive logic, the differential output signal is the positive logic. Generally, in the differential amplification circuit, a logical inversion of the differential signal can be easily performed by mutually interchanging and connecting paired signals (components) constituting the differential signal.

For example, when the differential output signal of the differential amplification circuit is input to a next-stage circuit, the positive-phase output signal and the negative-phase output signal constituting the differential output signal are interchanged before connected to the next-stage circuit, thereby inverting the logic of the differential output signal input to the next-stage circuit. Therefore, the positive-phase input signal and the negative-phase input signal of the cell amplification circuit may be interchanged and used, or the positive-phase output signal and the negative-phase output signal may be interchanged and used according to a relationship between the differential input signal received by the driving circuit 100 and the differential output signal output to the next-stage circuit or the optical modulator (the optical modulator 1b). As described in the following, the negative-phase input terminal Cell-inb and the transistor Tr3 of the differential pair circuit Db are electrically connected and the positive-phase input terminal Cell-in and the transistor Tr4 of the differential pair circuit Db are electrically connected via the emitter-follower circuit Dc.

The emitter-follower circuit Dc includes a transistor Tr11, a transistor Tr12, a resistive element R5, and a resistive element R6. A base of the transistor Tr11 is electrically connected to the negative-phase input terminal Cell-inb. A collector of the transistor Tr11 is electrically connected to a power supply Vcc via a power line. An emitter of the transistor Tr11 is grounded via the resistive element R5 (that is, electrically connected to a ground line).

The emitter of the transistor Tr11 is electrically connected to a base of the transistor Tr3 of the differential pair circuit Db. A base of the transistor Tr12 is electrically connected to the positive-phase input terminal Cell-in. A collector of the transistor Tr12 is electrically connected to the power supply Vcc via the power line. An emitter of the transistor Tr12 is grounded via the resistive element R6 (that is, electrically connected to the ground line). The emitter of the transistor Tr12 is electrically connected to a base of the transistor Tr4 of the differential pair circuit Db.

The differential pair circuit Db is configured by making a circuit having the transistor Tr3 and a resistive element R1 (a first resistive element) and a circuit having the transistor Tr4 and a resistive element R2 (a second resistive element) in a pair. In other words, in the differential pair circuit Db, emitters of the pair of transistors Tr3 and Tr4 are connected to each other via the resistive elements R1, R2. The differential pair circuit Db generates a differential signal according to the differential input signal. The base of the transistor Tr3 is electrically connected to the emitter of the transistor Tr11 (one output terminal of the emitter-follower circuit). The emitter of the transistor Tr3 is electrically connected to the resistive element R1.

The emitter of the transistor Tr3 is electrically connected to the current source Is via the resistive element R1. The collector of the transistor Tr3 is electrically connected to an emitter of the transistor Tr5. The base of the transistor Tr4 is electrically connected to the emitter of the transistor Tr12 (another output terminal of the emitter-follower circuit). The emitter of the transistor Tr4 is electrically connected to the resistive element R2. The emitter of the transistor Tr4 is connected to the current source Is via the resistive element R2. The collector of the transistor Tr4 is connected to an emitter of the transistor Tr6.

The transistor Tr5 and the transistor Tr6 are provided for the purpose of keeping the differential output terminal Dd in a high impedance. A base of the transistor Tr5 is electrically connected to a base of the transistor Tr6. Both the bases of the transistor Tr5 and the transistor Tr6 are grounded via a capacitor C1. A collector of the transistor Tr5 is electrically connected to the positive-phase output terminal Cell-out. A collector of the transistor Tr6 is electrically connected to the negative-phase output terminal Cell-outb. It should be noted that a collector of the differential pair circuit Db may be directly connected to the positive-phase output terminal Dout and the negative-phase output terminal Doutb by omitting the transistor Tr5 and the transistor Tr6.

The current source Is supplies a current (a source current) to the differential pair circuit Db via a connecting point P1 between the resistor R1 and the resistor R2. The current source Is includes a transistor Tr7, a resistive element R7, and a capacitor C2. One end of the current source Is is connected to the connecting point P1 between the resistive element R1 and the resistive element R2. The current source Is is connected to the differential pair Db and supplies the current to the differential pair circuit Db. A base of the transistor Tr7 is electrically connected to the voltage terminal Vcon1. The base of the transistor Tr7 is grounded via the capacitor C2 (that is, electrically connected to the ground line). An emitter of the transistor Tr7 is grounded via the resistive element R7. A collector of the transistor Tr7 is electrically connected to the emitter of the transistor Tr3 via the resistive element R1, and is electrically connected to the emitter of the transistor Tr4 via the resistive element R2.

The capacitor C2 suppresses a high frequency electrical fluctuation at a base potential of the transistor Tr7 caused by an influence of noise, surge, spike, or the like. A magnitude (amplitude) of a collector current of the transistor Tr7 can be changed by adjusting a direct current value given to the voltage terminal Vcon1 from the outside. This collector current is a current supplied from the current source Is to the differential pair circuit Db. In other words, the transistor Tr7 operates as a voltage control current source.

One end of a resistive element R4 is connected to the power supply Vcc via the power line, and one end of a resistive element R3 is grounded. Another end of the resistor R4 and another end of the resistor R3 are electrically connected. In other words, the resistor R4 and the resistor R3 are connected in series between the power line connected to the power supply Vcc and the ground. A connecting point between the resistive element R4 and the resistive element R3 is electrically connected to the base of the transistor Tr5 and the base of the transistor Tr6. The resistor R3 and the resistor R4 constitute a so-called voltage dividing circuit, and can adjust a value of a voltage applied to the base of each of the transistor Tr5 and the transistor Tr6 by changing a ratio of resistance values.

The plurality of differential amplification circuits Amp of the driving circuit 100 is formed with one or more differential amplification circuits Amp1 (first differential amplification circuits) each provided with the delay line Zadd (the transmission line) between the connecting point P1 and the current source Is and one or more differential amplification circuits Amp2 (a differential amplification circuit identical to Cell-1 or the like in FIG. 5) (a second differential amplification circuit) each having the connecting point P1 and the current source Is directly connected. The delay line Zadd has a delay time set so that a phase of a common-mode signal generated by the second differential amplification circuit is different from a phase of a common-mode signal generated by the first differential amplification circuit.

As illustrated in FIG. 10, the current source Is of the first differential amplification circuit among the plurality of differential amplification circuits Amp of the driving circuit 100 is electrically connected to the connecting point P1 via the delay line Zadd, and supplies the current to the differential pair circuit Db via the delay line Zadd. The current source Is of the second differential amplification circuit among the plurality of differential amplification circuits Amp of the driving circuit 100 is directly connected to the connecting point P1 without passing through the delay line Zadd, and directly supplies the current to the differential pair circuit Db. The differential pair circuit splits the source current according to the differential input signal received from the pair of input-side transmission lines for generating a differential signal. As described above, the first differential amplification circuits and the second differential amplification circuits are mutually connected in parallel between the input-side transmission lines Lin1 to Lin4, Linb1 to Linb4 and the output-side transmission lines Lout0 to Lout3, Loutb0 to Loutb3.

In the plurality of differential amplification circuits Amp of the driving circuit 100, an absolute value of a difference between the number of first differential amplification circuits and the number of second differential amplification circuits is 0 or 1 (within 1). For example, when the driving circuit 100 includes 2M (M is an integer of 1 or more, and M=2 in FIG. 8) differential amplification circuits Amp (that is, when the driving circuit 100 includes an even number of differential amplification circuits Amp), the number of first differential amplification circuits is M, and the number of second differential amplification circuits is also M. Further, when the driving circuit 100 includes 2M+1 differential amplification circuits Amp (that is, when the driving circuit 100 includes 3 or more odd number of differential amplification circuits Amp), the number of first differential amplification circuits is M+1 and the number of second differential amplification circuits is M, or the number of first differential amplification circuits is M and the number of second differential amplification circuits is M+1.

The delay line Zadd in the circuit configuration of the differential amplification circuit Amp has no influence on differential amplification of the first differential amplification circuit Amp1.

However, the delay line Zadd can affect common-mode amplification of the first differential amplification circuit Amp1. In other words, a common-mode output current of the first differential amplification circuit Amp1 is delayed by the delay line Zadd.

The delay line Zadd is configured with a transmission line having, for example, a characteristic impedance from 50 [Ω] to 80 [Ω] inclusive. The delay line Zadd can cause a delay time from 3 [ps] to 10 [ps] inclusive with respect to a signal input to the delay line Zadd (a common-mode current signal).

For example, when the driving circuit 100 includes eight differential amplification circuits Amp, the common-mode current signal output from the differential amplification circuit Amp1 (the first differential amplification circuit) with the delay line Zadd (the transmission line) has a phase different from a phase of the common-mode current signal output from the differential amplification circuit Amp2 (the second differential amplification circuit) without the delay line Zadd and in which the differential pair circuit Db and the current source Is are directly connected. and Accordingly, a mismatch is caused on the phases of the common-mode current signals output from the driving circuit 100, and the plurality of common-mode signals mutually having different phases weakens with each other. Therefore, the common-mode reduction ratio CMRR [dB] of the driving circuit 100 can be increased and improved. An advantage of improving the common-mode reduction ratio CMRR [dB] of the driving circuit 100 according to this exemplary embodiment will be described below in detail with reference to formulas (FIG. 13).

Figure 11A:
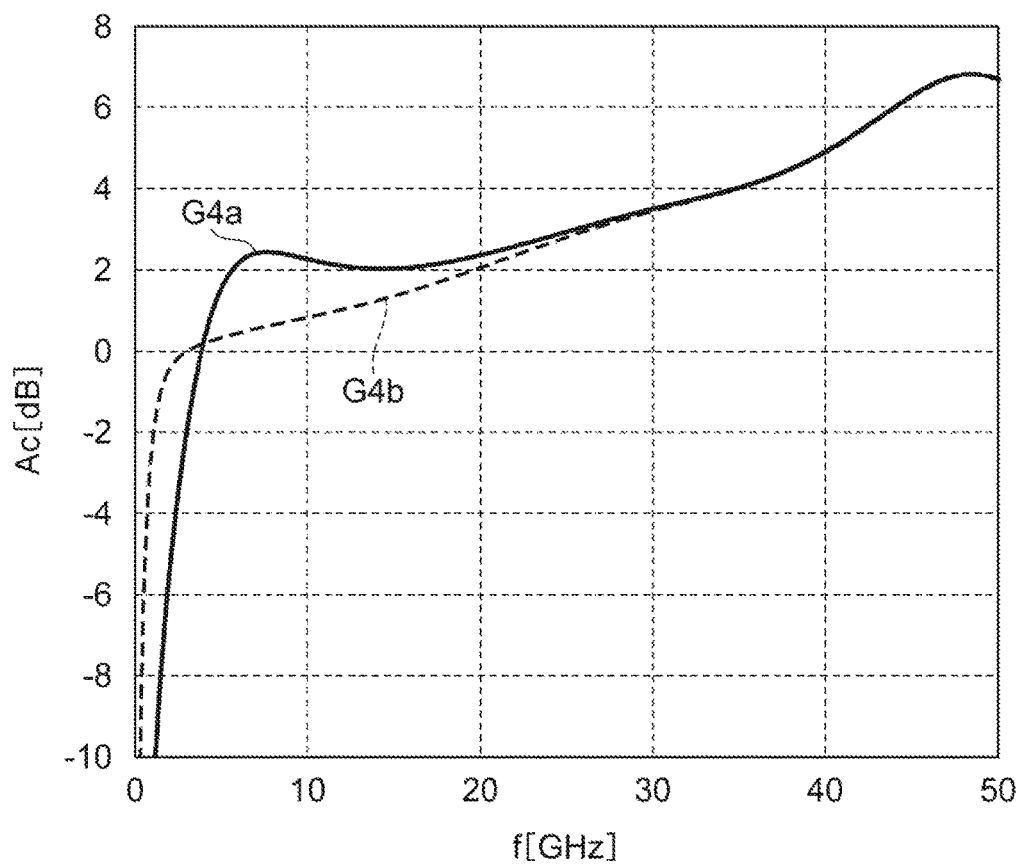
FIG. 11A is a graph illustrating a frequency characteristic of a common-mode gain of the driving circuit according to the exemplary embodiment.
Figure 11B:
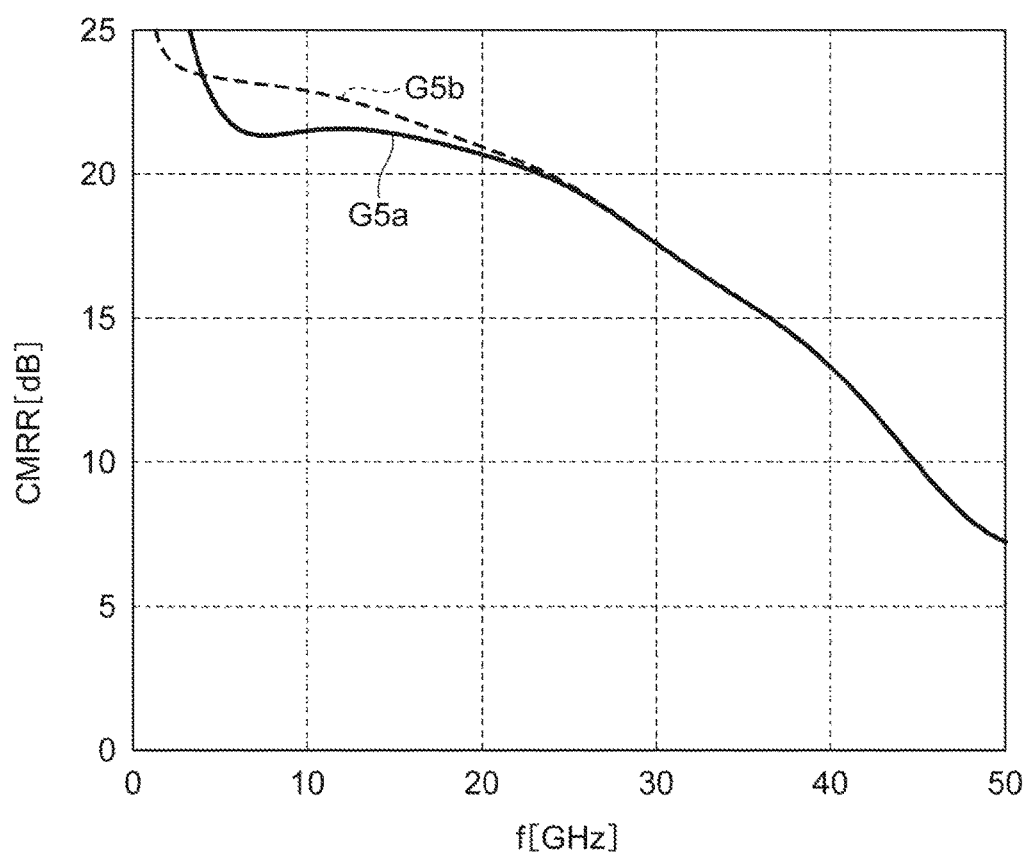
FIG. 11B is a graph illustrating a frequency characteristic of a common-mode rejection ratio of the driving circuit according to the exemplary embodiment.

FIGS. 11A and 11B illustrate simulation results of frequency characteristics (Ac, CMRR) of the driving circuit. The results (curves G4b, G5b) illustrated in FIGS. 11A and 11B are results when the number of cell amplification circuits (differential amplification circuits) Amp is eight. FIGS. 11A and 11B also include, for comparison, simulation results (curves G4a, G5a) of the optical modulator driving circuit 1c in the comparative example. Further, the curves G4b and G5b are results obtained by assuming that all of the differential amplification circuits Amp in the driving circuit do not include the delay line Zadd in FIG. 10 in the same way as the comparative example.

FIG. 11A is a graph illustrating a common-mode gain Ac [dB] obtained from the driving circuit 100. In FIG. 11A, a horizontal axis represents a frequency f [GHz] of a differential input signal, and a vertical axis represents the common-mode gain Ac [dB] for a differential output signal. The curve G4b in FIG. 11A is a result obtained when a resistance value of the resistive element R8 is 50 [Ω]. FIG. 11B is a graph illustrating a common-mode rejection ratio CMRR [dB] of the driving circuit. In FIG. 11B, a horizontal axis represents the frequency f [GHz] of the differential input signal, and a vertical axis represents the common-mode rejection ratio CMRR [dB] obtained from the result of the common-mode gain Ac illustrated in FIG. 11A.

The curve G4a is a result obtained from the configuration in the comparative example illustrated in FIGS. 2 and 5, and the curve G4b is a result obtained from the driving circuit 100 in FIG. 8. Wherein, the number of cell amplification circuits Amp is eight. The curve G4a corresponds to the curve G1 in FIG. 7A. The curve G4b is a result obtained from the configuration in which all of the differential amplification circuits Amp in the driving circuit 100 do not include the delay line Zadd in FIG. 10 (that is, a case where all of the differential amplification circuits Amp in the driving circuit 100 have the configuration of the second amplification circuit) in the same way as the comparative example.

In the simulation from which the results illustrated in FIGS. 11A and 11B have been obtained, a differential gain Ad [dB] of the driving circuit 100 corresponds to the results obtained in the comparative example illustrated in FIGS. 2 and 5 (the result illustrated by the curve G2 in FIG. 7B). This is because even if the current sources Is of the plurality of cell amplification circuits Amp are different, differential operation thereof is hardly influenced by the difference, as described above.

The curve G5a is a result obtained from the configuration in the comparative example illustrated in FIGS. 2 and 5. The result illustrated by the curve G5a corresponds to the result illustrated by the curve G3 in FIG. 7C. More specifically, the curve G5a corresponds to the common-mode rejection ratio CMRR [dB] obtained by using the result (Ac [dB]) illustrated by the curve G4a (the curve G1) and the result (Ad [dB]) illustrated by the curve G2 in FIG. 7B. The curve G5b is a result obtained from the driving circuit 100 in FIG. 8. More specifically, the curve G5b corresponds to the common-mode rejection ratio CMRR [dB] obtained by using the result (Ac [dB]) illustrated by the curve G4b and the result (Ad [dB]) illustrated by the curve G2 in FIG. 7B.

With reference to FIGS. 11A and 11B, in the driving circuit 100 in FIG. 8 having the resistive element R8, the common-mode gain Ac [dB] is reduced to about 2 [dB] at maximum when the frequency f of the differential input signal ranges about from 4 [GHz] to 10 [GHz], as compared with the driving circuit 1c (the optical modulator driving circuit in FIG. 2) in the comparative example having no resistor R8. As a result, the common-mode rejection ratio CMRR [dB] is increased by about 2 [dB].

For example, as illustrated in FIG. 4, when a delay time of the high frequency transmission line le between the driving circuit and the DAC is about 50 [ps], the common-mode component of the differential input signal (the common-mode signal) is reflected between the differential input terminal of the driving circuit and the differential output terminal of the DAC, thereby forming a standing wave in the frequency f of 10 [GHz] or less.

In this case, in the driving circuit 100 where the frequency f is 10 [GHz] or less and the common-mode reduction ratio CMRR [dB] is comparatively high, the common-mode signal can be sufficiently reduced. It should be noted that the results illustrated in FIGS. 11A and 11B can be similarly obtained when the driving circuit 100 includes one or more differential amplification circuits Amp illustrated in FIG. 10. The differential amplification circuits Amp in this case may be either the differential amplification circuit with the delay line Zadd (the first differential amplification circuit) or the differential amplification circuit without the delay line Zadd (the second differential amplification circuit).

Figure 12:
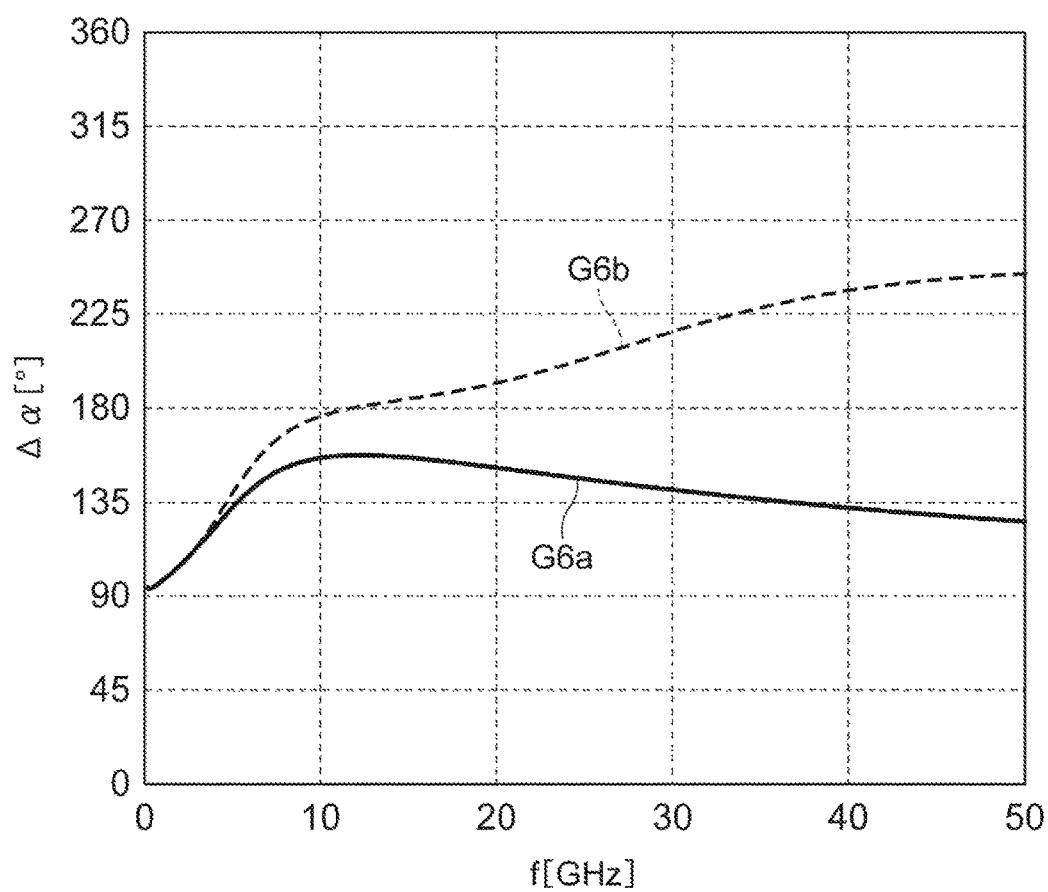
FIG. 12 is a graph illustrating frequency dependence of a phase variation that occurs in a current source of the cell amplification circuit (the differential amplification circuit)

FIG. 12 is a graph illustrating frequency characteristics of a phase deviation value Δα[°] of a current signal that occurs in the current source Is of the differential amplification circuit Amp in FIG. 10 when the common-mode signal with the frequency f [GHz] is input to the differential input terminal.

Results illustrated in FIG. 12 are simulation results. The results illustrated in FIG. 12 are results obtained when the number of differential amplification circuits Amp is eight. In the simulation from which the results illustrated in FIG. 12 have been obtained, the delay line Zadd has a characteristic impedance of 50 [Ω] and a delay time of 4 [ps]. In FIG. 12, a horizontal axis represents a frequency f [GHz] of a common-mode input signal, and a vertical axis represents a phase deviation value Δα[°] of a differential current signal that occurs in the current source Is. A curve G6a is a result of the configuration in the comparative example illustrated in FIGS. 2 and 5, and a curve G6b corresponds to a result of the differential amplification circuit Amp with the delay line Zadd in FIG. 10 in the driving circuit 100 in FIG. 8.

With reference to FIG. 12, when the frequency f is about 40 [GHz], a difference in the phase deviation value Δα[°] between the curve G6a and the curve G6b is about 100 [°]. This phase deviation value Δα[°] of about 100 [°] is about 7 [ps] if converted into the delay time. Since the delay time of the delay line Zadd is 4 [ps], theoretically, it is estimated that the delay time of about 8 [ps] can occur due to reciprocation (round trip of a signal) on the delay line Zadd. However, when the frequency f [GHz] is generally 40 [GHz] or more, an impedance mismatch occurs between the delay line Zadd and the collector of transistor Tr7 of the current source Is. Accordingly, an actual delay time of the delay line Zadd caused by this impedance mismatch (about 7 [ps]) is shorter than the theoretical value (about 8 [ps]).

FIG. 13 is a mathematical formula group 2 for explaining that the common-mode component of the output signal (the common-mode signal) output from the driving circuit is reduced.

All of a formula (2-1), a formula (2-2), and a formula (2-3) illustrated in FIG. 13 correspond to a case where the driving circuit includes eight differential amplification circuits Amp.

A current $I_{OUT}$ illustrated in FIG. 13 is the common-mode component of the output signal output from the driving circuit, and is represented by the formula (2-1). $I_1$ to $I_8$ each represent an amplitude of the common-mode signal output from each of the eight cell amplification circuits (differential amplification circuits) Amp. j represents an imaginary number. t represents a time. ω is an angular frequency, and ω=2π×f. f represents a frequency of the signal input to each of the eight differential amplification circuits Amp. $t_{d1}$ to $t_{d8}$ each represent a relative delay time difference of the signal output from each of the eight differential amplification circuits Amp, and this delay time difference is generated by the delay line Zadd.

When the driving circuit is phase-matched (when the delay line Zadd is not provided in all of the eight differential amplification circuits Amp included in the driving circuit, that is, when all of the eight differential amplification circuits Amp are the above-described second differential amplification circuits), all of the delay time differences $_{td1}$ to $t_{d8}$ become 0. In this case, when $I_a=I_1+I_2+\ldots I_8$, $I_{OUT}$ is represented in the formula (2-2).

Further, in the driving circuit 100 according to the exemplary embodiment, when the number of plurality of differential amplification circuits Amp is eight, the delay line Zadd having the same delay time ($t_d$) is provided in each of the four, i.e., half, differential amplification circuits Amp, and the delay line Zadd is not provided in all the four, i.e., remaining half, differential amplification circuits Amp. In other words, the four differential amplification circuits are the above-described first differential amplification circuits, and the remaining four are the above-described second differential amplification circuits. In this case, when all the $I_1$ to $I_8$ are equal, the current $I_{OUT}$ is represented in the formula (2-3).

Figure 14:
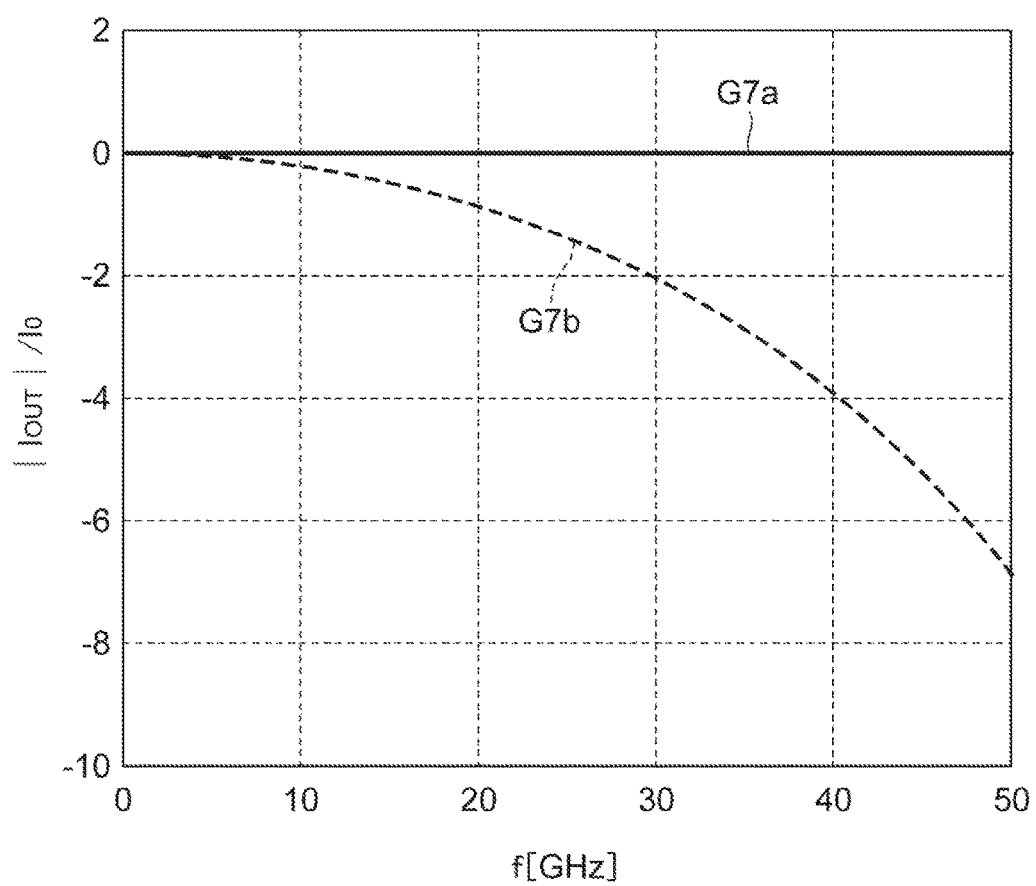
FIG. 14 is a graph illustrating frequency dependence of the common-mode component in the output signal of the driving circuit.

FIG. 14 is a graph illustrating a relationship between the frequency f [GHz] of the input signal and the amplitude of the common-mode component of the output signal of the driving circuit. In FIG. 14, a horizontal axis represents the frequency f [GHz] of the input signal, and a vertical axis represents a value [dB] where an absolute value of $I_{OUT}$ ($|I_{OUT}|$) is normalized by a scalar value ($I_0$) in a DC of a frequency f=0 [GHz].

$I_{OUT}$ represented in the formula (2-2) is illustrated by a curve G7a in FIG. 14. Further, the formula (2-3) corresponds to the driving circuit 100 according to the exemplary embodiment illustrated in FIG. 8, and is illustrated in a curve G7b in FIG. 14 when $t_d$=7 [ps] in particular. With reference to the curve G7b, when $t_d$=7 [ps], reduction of the common-mode signal caused by the delay time difference of the delay line Zadd is about 3.8 [dB] in the frequency f [GHz] of about 40 [GHz].

Therefore, in a case of the configuration corresponding to the formula (2-3) (the driving circuit 100 according to the exemplary embodiment), that is, in a case where an absolute value of a difference between the number of first differential amplification circuits with the delay lines Zadd and the number of second differential amplification circuits without the delay line Zadd is 0 or 1 in the plurality of differential amplification circuits Amp in the driving circuit, a common-mode reduction ratio CMRR [dB] can be improved.

It should be noted that, even if two terms corresponding to the common-mode components are arbitrarily selected and changed in the formula (2-3), the same result can be obtained because of performing addition in the mathematical formula. In other words, in order to improve the common-mode reduction ratio CMRR, a position of the first differential amplification circuit in the differential amplification circuit and a position of the second differential amplification in the differential amplification circuit may be arbitrarily selected regarding a total of eight differential amplification circuits. For example, the four second differential amplification circuits may be disposed after the four first differential amplification circuits are disposed, or the first differential amplification circuit and the second differential amplification circuit may be disposed alternately one by one, from the differential input terminals Din, Dinb to the differential output terminals Dout, Doutb.

Figure 15A:
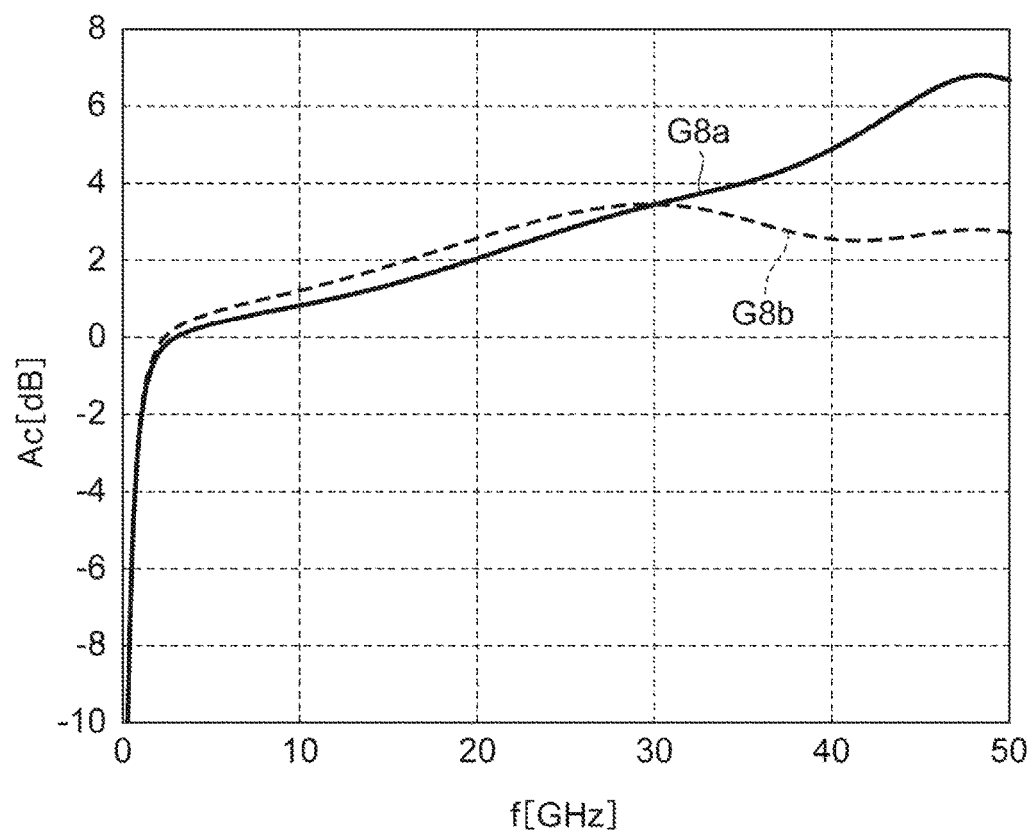
FIG. 15A is a graph illustrating a frequency characteristic of a common-mode gain of the driving circuit according to the exemplary embodiment.
Figure 15B:
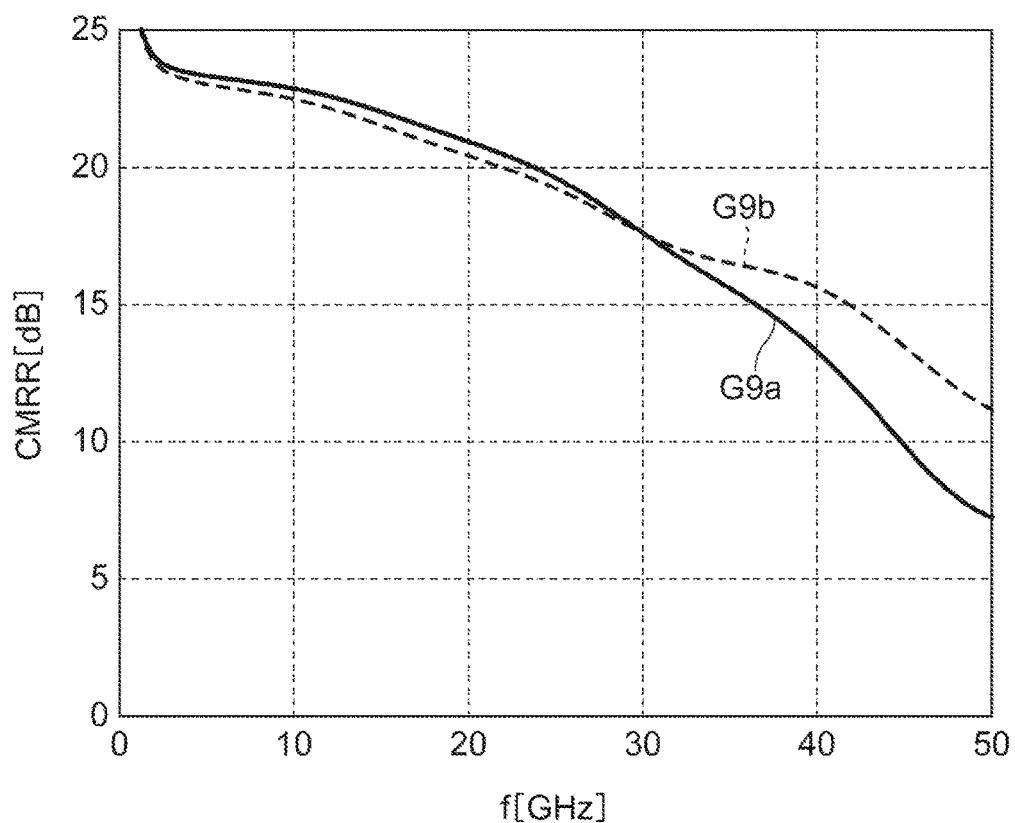
FIG. 15B is a graph illustrating a frequency characteristic of a common-mode rejection ratio of the driving circuit according to the exemplary embodiment.

FIGS. 15A and 15B illustrate simulation results of frequency characteristics (Ac, CMRR) of the optical modulator driving circuit 100 in FIG. 8. The results illustrated in FIGS. 15A and 15B are results when a total number of differential amplification circuits Amp is eight. FIG. 15A is a graph illustrating a frequency characteristic of a common-mode gain Ac [dB] obtained from the driving circuit 100. In FIG. 15A, a horizontal axis represents a frequency f [GHz] of an input signal, and a vertical axis represents a common-mode gain Ac [dB] of an output signal.

A curve G8b in FIG. 15A is a result of a case where the delay line Zadd has a characteristic impedance of 50 [Ω] and a delay time of 4 [ps] and the resistor R8 has a resistance value of 50 [Ω]. FIG. 15B is a graph illustrating a frequency characteristic of a common-mode reduction ratio CMRR [dB] in the driving circuit. In FIG. 15B, a horizontal axis represents the frequency f [GHz] of the input signal, and a vertical axis represents a common-mode reduction ratio CMRR [dB] obtained from the result illustrated in FIG. 15A.

A curve G8a is a result of the configuration in the comparative example illustrated in FIGS. 2 and 5, and the curve G8b is a result of the driving circuit 100 in FIG. 8. The curve G8a corresponds to the curve G4b in FIG. 11A. The curve G8b is a result obtained when, among the total number of eight differential amplification circuits Amp of the driving circuit 100, the delay line Zadd having the same delay time (about 4 [ps]) is provided in each of the four, i.e., half, differential amplification circuits Amp and the delay line Zadd is not provided in all the four, i.e., remaining half, differential amplification circuits Amp. In other words, the number of first differential amplification circuits is four, and the number of second differential amplification circuits is four.

In the simulation from which the results illustrated in FIGS. 15A and 15B have been obtained, a differential gain Ad [dB] is identical to the result obtained from the configuration in the comparative example illustrated in FIGS. 2 and 5 (the result illustrated by the curve G2 in FIG. 7B).

A curve G9a is a result obtained from the configuration in the comparative example illustrated in FIGS. 2 and 5. Specifically, the curve G9a represents a common-mode reduction ratio CMRR [dB] obtained by using the common-mode gain Ac [dB] illustrated by the curve G8a (the curve G4b) and the differential gain Ad [dB] illustrated by the curve G2 in FIG. 7B. A curve G9b is a result obtained from the driving circuit 100 in FIG. 8. Specifically, the curve G9b represents a common-mode reduction ratio CMRR [dB] obtained by using the common-mode gain Ac [dB] illustrated by the curve G8b in FIG. 15A and the differential gain Ad [dB] illustrated by the curve G2 in FIG. 7B.

As illustrated in FIG. 15B, when the frequency f [GHz] is about 40 [GHz], the common-mode reduction ratio CMRR

[dB] of the driving circuit 100 can be increased by about 2.2 [dB] in a comparison with the comparative example.

As illustrated in FIGS. 11B and 15B, in the optical modulator driving circuit 100 according to the exemplary embodiment, the common-mode reduction ratio CMRR [dB] can be improved over a comparatively wide range of the frequency f [GHz] of the input signal (particularly, in about 10 [GHz] and about 40 [GHz]).

According to the above-described exemplary embodiment, improvement in a common-mode reduction ratio of an optical modulator driving circuit can be expected.

A principle of the present invention has been illustrated and described above in the preferred exemplary embodiment. However, it will be appreciated by those skilled in the art that changes could be made to arrangements and details without deviating from the principle. The present invention is not limited to a specific configuration disclosed in the exemplary embodiment. Therefore, a right can be claimed to all modifications and variations derived from the claims and their spirit.

What is claimed is:

1. A driving circuit for driving an optical modulator comprising:
    differential input terminals configured to receive a differential input signal from an outside;
    a pair of input-side transmission lines configured to transmit the differential input signal received through the differential input terminals;
    a plurality of differential amplification circuits configured to receive the differential input signal through the pair of input-side transmission lines, to amplify the differential input signal and to output respective amplified differential input signals as differential signals, the plurality of differential amplification circuits consisting of a plurality of first differential amplification circuits and a plurality of second differential amplification circuits, each first differential amplification circuit including a first differential pair circuit to generate one of the differential signals according to the differential input signal, a delay line to delay a passing signal, and a first current source to supply a first current to the first differential pair circuit via the delay line, each second differential amplification circuit including a second differential pair circuit to generate one of the differential signals according to the differential input signal, and a second current source to directly supply a second current to the second differential pair circuit;
    a pair of output-side transmission lines configured to transmit the differential signals output from the plurality of differential amplification circuits; and
    differential output terminals configured to mutually superpose the differential signals output from the plurality of differential amplification circuits for outputting a superposed signal to the outside,
    wherein the plurality of first differential amplification circuits and the plurality of second differential amplification circuits are mutually connected in parallel between the pair of input-side transmission lines and the pair of output-side transmission lines.

2. The driving circuit according to claim 1, wherein a number of the first differential amplification circuits is equal to a number of the second differential amplification circuits.

3. The driving circuit according to claim 2, wherein the first differential amplification circuits are disposed adjacent to each other by a number of the first differential amplification circuits along the input-side transmission lines, and the second differential amplification circuits are disposed adjacent to each other by a number of the second differential amplification circuits along the input-side transmission lines.

4. The driving circuit according to claim 2, wherein the first differential amplification circuits and the second differential amplification circuits are each disposed alternately along the input-side transmission lines.

5. The driving circuit according to claim 1, wherein a difference between the number of the first differential amplification circuits and the number of the second differential amplification circuits is one.

6. The driving circuit according to claim 1, wherein the delay line in each first differential amplification circuit has a delay time set so that a phase of a common-mode signal generated by each second differential amplification circuit is different from a phase of a common-mode signal generated by each first differential amplification circuit.

7. The driving circuit according to claim 6, wherein the delay line in each first differential amplification circuit includes a transmission line having the set delay time that corresponds to a difference between the phase of a common-mode signal generated by each second differential amplification circuit and the phase of a common-mode signal generated by each first differential amplification circuit.

8. The driving circuit according to claim 1, further comprising:
    a voltage circuit configured to receive an adjustment voltage from the outside and to generate an internal voltage according to the adjustment voltage; and
    a resistive element,
    wherein the first current source of each first differential amplification circuit and the second current source of each second differential amplification circuit receive the internal voltage from the voltage circuit via the resistive element.

9. The driving circuit according to claim 8,
    wherein the first current source varies the first current according to the internal voltage received via the resistive element, and
    the second current source varies the second current according to the internal voltage received via the resistive element.

10. A driving circuit for driving an optical modulator comprising:
    differential input terminals configured to receive a differential input signal from an outside;
    a pair of input-side transmission lines configured to transmit the differential input signal received by the differential input terminals;
    a plurality of differential amplification circuits each including a current source to supply a source current and a differential pair circuit to split the source current according to the differential input signal received from the pair of input-side transmission lines and to generate a respective differential signal;
    a pair of output-side transmission lines configured to transmit the respective differential signals output from the plurality of differential amplification circuits;
    differential output terminals configured to mutually superpose the respective differential signals output from the plurality of differential amplification circuits with each other for outputting a superposed differential signal to the outside;

a voltage circuit configured to receive an adjustment voltage from the outside and to generate an internal voltage according to the adjustment voltage; and a resistive element, wherein the current source of each differential amplification circuit receives the internal voltage from the voltage circuit via the resistive element.

* * * * *